United States Patent
Bromberg et al.

(10) Patent No.: US 9,300,301 B2
(45) Date of Patent: Mar. 29, 2016

(54) NONVOLATILE MAGNETIC LOGIC DEVICE

(71) Applicant: Carnegie Mellon University, Pittsburgh, PA (US)

(72) Inventors: David M. Bromberg, Pittsburgh, PA (US); Jian-Gang Zhu, Pittsburgh, PA (US); Lawrence Pileggi, Pittsburgh, PA (US); Vincent Sokalski, Pittsburgh, PA (US); Matthew Moneck, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 14/649,570

(22) PCT Filed: Dec. 4, 2013

(86) PCT No.: PCT/US2013/073073
§ 371 (c)(1),
(2) Date: Jun. 4, 2015

(87) PCT Pub. No.: WO2014/089182
PCT Pub. Date: Jun. 12, 2014

(65) Prior Publication Data
US 2015/0311901 A1   Oct. 29, 2015

Related U.S. Application Data

(60) Provisional application No. 61/797,305, filed on Dec. 4, 2012, provisional application No. 61/849,223, filed on Jan. 21, 2013.

(51) Int. Cl.
*H03K 19/18* (2006.01)
*H03K 19/20* (2006.01)
(Continued)

(52) U.S. Cl.
CPC .............. *H03K 19/18* (2013.01); *G11C 11/161* (2013.01); *G11C 11/1673* (2013.01); *G11C 11/1675* (2013.01); *H01L 43/08* (2013.01); *H03K 19/20* (2013.01)

(58) Field of Classification Search
CPC .. G11C 11/15; G11C 11/161; G11C 11/1673; G11C 11/1675; G11C 11/5607; G11C 19/0808; G11C 15/046; H01L 43/08; H01L 27/222; B82Y 25/00; H01F 10/3254; H01F 10/3286; H01F 10/329; Y10S 977/935; G11B 5/3903; H03K 19/18; H03K 19/20
See application file for complete search history.

(56) References Cited

U.S. PATENT DOCUMENTS 6,034,887 A *  3/2000  Gupta ................... B82Y 25/00
                                                      257/E27.005
8,004,881 B2 * 8/2011  Zhu ......................... G11C 11/16
                                                      365/148

(Continued)

FOREIGN PATENT DOCUMENTS

WO   WO2014089182    6/2014

OTHER PUBLICATIONS

International Search Report and Written Opinion dated Mar. 27, 2014 for Int'l. Appln. No. PCT/US2013/073073 (13 pgs.).

*Primary Examiner* — Vibol Tan
(74) *Attorney, Agent, or Firm* — Fish & Richardson P.C.

(57) ABSTRACT

In one aspect, a nonvolatile magnetic logic device comprises an electrically insulating layer, a write path, and a read path. The write path comprises a plurality of write path terminals and a magnetic layer having a uniform magnetization direction that is indicative of a direction of magnetization of the magnetic layer in a steady state. A logic state is written to the nonvolatile magnetic logic device by passing a current through the plurality of write path terminals. The read path comprises a plurality of read path terminals for evaluation of the logic state. The electrically insulating layer promotes electrical isolation between the read path and the write path and magnetic coupling of the read path to the write path.

32 Claims, 19 Drawing Sheets

(51) Int. Cl.
  *G11C 11/16* (2006.01)
  *H01L 43/08* (2006.01)

(56) References Cited

U.S. PATENT DOCUMENTS

| | | | | |
|---|---|---|---|---|
| 8,358,149 B2 * | 1/2013 | Katti | ................ | H03K 19/16 326/38 |
| 8,358,154 B2 * | 1/2013 | Katti | ................ | H03K 19/16 326/112 |
| 8,476,925 B2 * | 7/2013 | Zhu | ................ | G11C 11/16 326/38 |
| 8,482,968 B2 * | 7/2013 | Worledge | ................ | G11C 11/16 365/158 |
| 2009/0224300 A1 | 9/2009 | Yamagishi et al. | | |
| 2010/0072566 A1 | 3/2010 | Kang et al. | | |
| 2011/0233699 A1 | 9/2011 | Takenaga et al. | | |
| 2012/0120719 A1 | 5/2012 | Worledge | | |
| 2012/0251847 A1 | 10/2012 | Takenaga et al. | | |

\* cited by examiner under National Science Foundation grant number CCF1146799 and I-ARPA grant number N66001-12-C-2005. The government has certain rights in this invention.

NONVOLATILE MAGNETIC LOGIC DEVICE

CROSS-REFERENCE TO RELATED APPLICATIONS

This application is a §371 National Stage Application of PCT/US2013/073073, filed Dec. 4, 2013, which, in turn, claims the benefit of priority under 35 U.S.C. §119(e) to provisional U.S. Patent Application No. 61/849,223, filed Jan. 21, 2013, and provisional U.S. Patent Application No. 61/797,305, filed Dec. 4, 2012. This application is related to U.S. patent application Ser. No. 12/898,548, filed Oct. 5, 2010, issued Jul. 2, 2013, as U.S. Pat. No. 8,476,925. The entire contents of each of the above applications are hereby incorporated by reference.

STATEMENT REGARDING FEDERALLY SPONSORED RESEARCH AND DEVELOPMENT

This invention was made with partial government support under National Science Foundation grant number CCF1146799 and I-ARPA grant number N66001-12-C-2005. The government has certain rights in this invention.

FIELD OF USE

The present disclosure relates to nonvolatile magnetic logic devices for logic circuit and memory applications.

BACKGROUND

Over the last decade, the semiconductor industry has demonstrated a significant, worldwide effort to develop commercially viable magnetic logic devices. Magnetoelectronic logic, where digital circuits are composed from magnetic logic devices, can potentially offer low energy, nonvolatile operation in an all-metallic process that may be decrease production costs as compared to currently available technology for digital circuits.

SUMMARY

The present disclosure describes apparatus and methods relating to a nonvolatile magnetic logic device. The device includes read and write terminals and electrically isolated read and write paths. The device may be switched between two stable single-domain logic states. The logic state is represented as the direction of magnetization of a magnetic layer in the write path. The logic state is nonvolatile and is retained when no power is applied to the device. The logic state is written to the device by passing a current through the magnetic layer of the write-path. The logic state is evaluated using a read path. The device may be used in logic circuit applications.

In one aspect of the present disclosure, a nonvolatile magnetic logic device comprises an electrically insulating layer, a write path adjacent to a first side of the electrically insulating layer, and a read path that is adjacent to a second side of the electrically insulating layer. The write path comprises a plurality of write path terminals and a magnetic layer having a uniform magnetization direction that is indicative of a direction of magnetization of the magnetic layer in a steady state. A logic state is written to the nonvolatile magnetic logic device by passing a current through the plurality of write path terminals. The direction of magnetization of the magnetic layer represents the logic state of the nonvolatile magnetic logic device, and the direction of magnetization is configured to be controlled by a direction of the current passed through the plurality of write path terminals. The read path comprises a plurality of read path terminals for evaluation of the logic state. The electrically insulating layer promotes electrical isolation between the read path and the write path and magnetic coupling of the read path to the write path, wherein the electrical isolation between the read path and the write path and the magnetic coupling promote passing of the current through the plurality of write path terminals, while the logic state is evaluated among the plurality of read path terminals.

Implementations of the disclosure can include one or more of the following features. The read path further comprises at least one magnetic tunnel junction (MTJ) that comprises a reference layer having at least one fixed magnetization direction, a free layer having a switchable magnetization direction, and a tunnel barrier sandwiched between the reference layer and free layer. The magnetic layer is a write path magnetic layer. In some implementations, one or more of the write path magnetic layer, the reference layer, and the free layer have an in-plane magnetic anisotropy. In some implementations, one or more of the magnetic layer, the reference layer, and the free layer have a perpendicular magnetic anisotropy. The magnetic layer and the free layer each has a shape comprising a major axis and minor axis, wherein the major axis is greater in length than the minor axis. The shape comprises one or more of a rectangular shape and an elliptical shape. The read path further comprises a synthetic antiferromagnetic layer that pins the at least one fixed magnetization direction of the reference layer of the at least one MTJ. The read path has a first resistance when the magnetization directions of the reference layer and the free layer are substantially parallel, and the read path has a second resistance when the magnetization directions of the reference layer and the free layer are substantially antiparallel. The free layer is configured to switch with the magnetization direction of the write path, and the concurrent switching of the switchable magnetization direction causes a resistance of the read path to switch between the first resistance and the second resistance to promote evaluation of the logic state. The second resistance has an increased value relative to a value of the first resistance. The second side of the electrically insulating layer is opposite to the first side of the electrically insulating layer. The write path further comprises an underlayer and a capping layer, and the magnetic layer is positioned between the underlayer and the capping layer. The read path further comprises a first magnetic tunnel junction (MTJ) that comprises a first reference layer that is separate from a second reference layer of a second MTJ and wherein the first MTJ further comprises a free layer that is shared with the second MTJ. The read path further comprises at least one magnetic tunnel junction (MTJ), and wherein a read path terminal of the plurality of read path terminals is electrically coupled to a free layer of the at least one MTJ via an ohmic contact. The magnetic layer of the write path is ferromagnetically or antiferromagnetically coupled to the free layer. The magnetic layer of the write path comprises two or more sub-layers, where each of the two or more sub-layers comprises a magnetic material, a first sub-layer of the two or more sub-layers has a thickness that differs from a thickness of a second sub-layer of the two more sub-layers, an adjacent layer of the two or more sub-layers is separated by a conductive spacer, and magnetization directions of the adjacent layers of the two or more sub-layers are substantially antiparallel. The electrically insulating layer comprises a magnetic material or a non-magnetic material. The direction of magnetization of the magnetic layer of the write path is further configured to be controlled using a bias magnetic field. The read path further comprises a giant magnetoresistive (GMR) sensor comprising a reference layer having at least one fixed magnetization direction, a free layer having a switchable magnetization direction, and a conductive interlayer sandwiched between the reference layer and free layer. The read path further comprises a synthetic antiferromagnetic layer that pins the at least one fixed magnetization direction of the reference layer of the at least one GMR sensor.

In yet another aspect of the present disclosure, a nonvolatile magnetic logic device comprises a write path, a read path, and an electrically insulating layer positioned between the write path and the read path. The write path comprises a plurality of write path terminals each comprising at least one of gold, silver, platinum, copper, tungsten, and aluminum; and a write path magnetic layer comprising at least one of iron, cobalt, and nickel, the magnetic layer having a uniform magnetization direction that is indicative of a direction of magnetization of the magnetic layer in a steady state. A logic state is written to the nonvolatile magnetic logic device by passing a current through the plurality of write path terminals. The direction of magnetization of the write path magnetic layer represents the logic state of the nonvolatile magnetic logic device, and the direction of magnetization is configured to be controlled by a direction of the current passed through the plurality of write path terminals. The read path comprises at least one magnetic tunnel junction (MTJ), a synthetic antiferromagnetic layer, and a plurality of read path terminals for evaluation of the logic state. The at least one MTJ comprising a free layer having a switchable magnetization direction, the free layer comprising an alloy of iron, cobalt, and boron; a reference layer having a fixed magnetization direction, the reference layer comprising an alloy of iron, cobalt, and boron; and an insulating barrier layer between the free layer and the reference layer, the insulating barrier layer comprising at least one of magnesium oxide and aluminum oxide. The synthetic antiferromagnetic layer comprises sub-layers of alternating cobalt alloys and non-magnetic ruthenium spacers, wherein the synthetic antiferromagnetic layer pins the fixed magnetization direction of the reference layer. Each of the plurality of read path terminals comprises at least one of gold, silver, platinum, copper, tungsten, and aluminum. The electrically insulating layer comprises an oxide of at least one of iron, nickel, and cobalt. The electrically insulating layer promotes electrical isolation between the read path and the write path and magnetic coupling of the read path to the write path. The electrical isolation and the magnetic coupling enables the current to be passed through the plurality of write path terminals, while the logic state is evaluated among the plurality of read path terminals.

In another aspect of the present disclosure, a method includes receiving, by a plurality of write path terminals of a write path of a nonvolatile magnetic logic device, a current that is used to write a logic state to the nonvolatile magnetic logic device; passing the current through the plurality of write path terminals of the write path to control a direction of magnetization of a magnetic layer of the write path, wherein the direction of magnetization is controlled by a direction of the current passing through the plurality of write path terminals and the magnetic layer, wherein the magnetic layer has a uniform magnetization direction that is indicative of the direction of magnetization, and wherein the direction of magnetization represents the logic state of the nonvolatile magnetic logic device; and providing, by a plurality of read path terminals of a read path of the nonvolatile magnetic logic device, a resistance corresponding to the logic state of the nonvolatile magnetic logic device for evaluation of the logic state; wherein the read path is electrically isolated from the write path and magnetically coupled to the write path, and wherein electrical isolation and magnetic coupling enable the current to be passed through the plurality of write path terminals, while the logic state is evaluated among the plurality of read path terminals.

Implementations of the disclosure can include one or more of the following features. The method includes concurrently switching a direction of magnetization of a free layer of the read path with the direction of magnetization of the magnetic layer of the write path to cause the provided resistance to switch between a first resistance and a second resistance corresponding to the logic state. The current comprises a first current, and providing the resistance corresponding to the logic state of the nonvolatile magnetic logic device comprises: receiving, by the plurality of read path terminals of the read path, a second current for evaluation of the logic state; passing the second current through the plurality of read path terminals, a reference layer, a tunnel barrier, and a free layer of the read path; providing a first resistance when a direction of magnetization of the free layer of the read path is substantially parallel to a direction of magnetization of the reference layer of the read path; and providing a second resistance when the direction of magnetization of the free layer of the read path is substantially antiparallel to the direction of magnetization of the reference layer of the read path. The method includes pinning a fixed magnetization direction of the reference layer of the read path using a synthetic antiferromagnetic layer in the read path. The second resistance has an increased value relative to a value of the first resistance. The method includes passing the second current through an ohmic contact between a read path terminal of the plurality of read path terminals and the free layer of the read path. The method includes magnetically coupling the read path to the write path comprises ferromagnetically coupling the read path to the write path. The method includes magnetically coupling the read path to the write path comprises antiferromagnetically coupling the read path to the write path. The method includes controlling the direction of magnetization of the magnetic layer using a bias magnetic field.

The details of one or more implementations are set forth in the accompanying drawings and the description below. Other features, object, and advantages will be apparent from the description, the drawings, and the claims.

DETAILED DESCRIPTION

Figure 1:
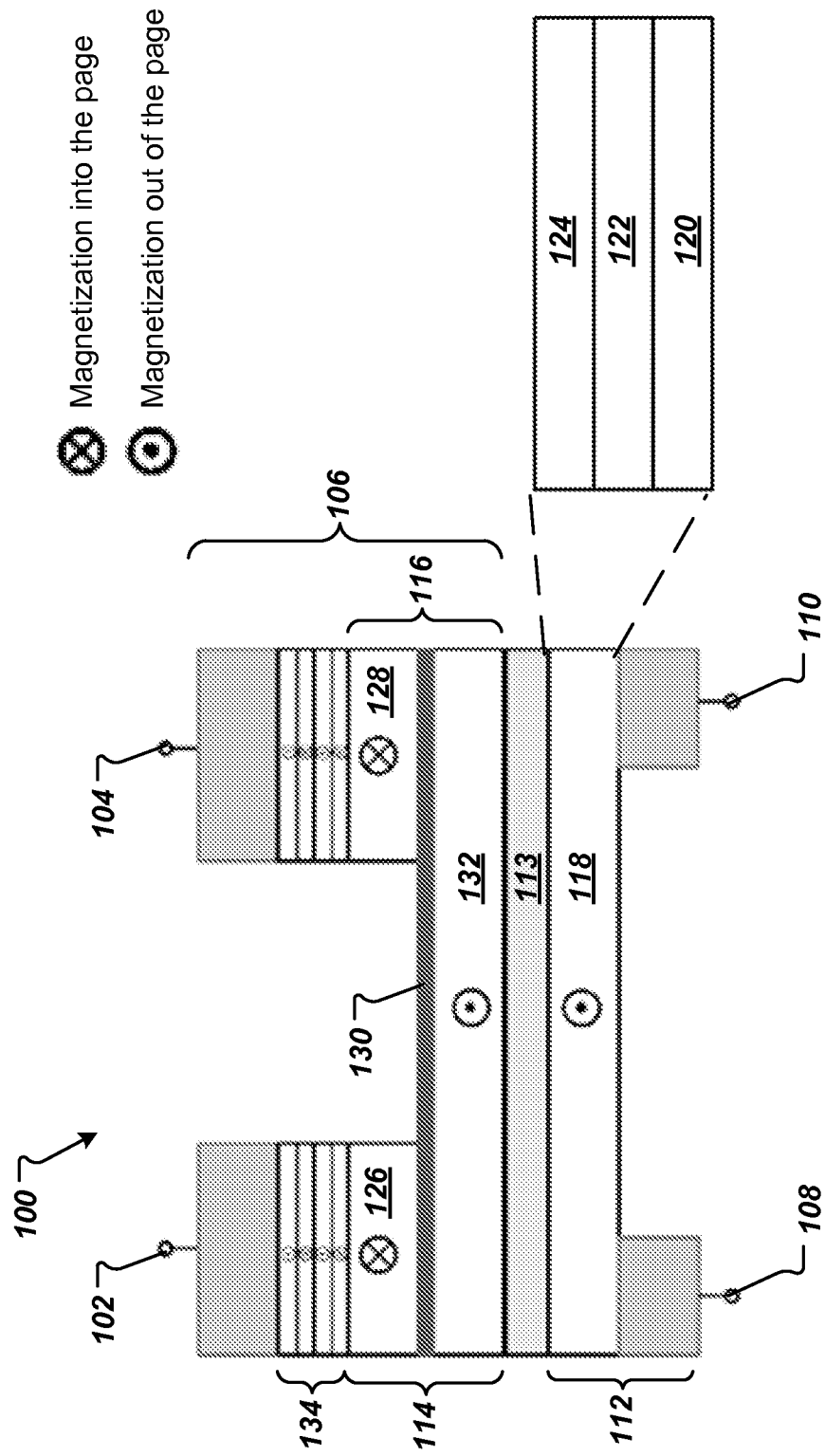
FIG. 1 shows an example of a nonvolatile magnetic logic device with an in-plane magnetic anisotropy.

FIG. 1 shows an example of a nonvolatile magnetic logic device 100 with in-plane magnetization (or magnetic anisotropy), where the direction of magnetization is parallel to the plane of the device 100, e.g., either pointing into the page or out of the page. The device 100 is nonvolatile and retains its resistance or logic state even when no power is applied to the device 100.

The device 100 has four terminals where read path terminals 102 and 104 define an input and an output of a read path 106, while write path terminals 108 and 110 define an input and an output of a write path 112. For the device 100, no fixed magnetization terminals are required for writing a logic state to the device 100, which may simplify the fabrication process of the device 100. The placement of the terminals are shown for ease of visibility, and does not exclude placement of the contacts elsewhere relative to the layers of the device 100. The read path 106 is electrically insulated but magnetically coupled to the write path 112 by an electrically insulating layer 113.

The read path 106 includes two magnetic tunnel junctions (MTJs) 114 and 116 between the read path terminals 102 and 104. The read path terminals 102 and 104 may be any suitable electrically conductive material, such as such as gold (Au), silver (Ag), platinum (Pt), copper (Cu), tungsten (W), aluminum (Al), or a combination of materials.

The MTJs 114 and 116 each include a reference layer 126 and 128, respectively. The MTJs 114 and 116 share a magnetic tunnel junction barrier layer 130 and a free layer 132. The reference layers 126 and 128 are magnetic layers that do not switch during the write process. The reference layers 126 and 128 enable high tunneling magnetoresistance when combined with the barrier layer 130 and the free layer 132. The reference layers 126 and 128 may include materials such as iron, cobalt, boron (FeCoB) alloys of varying composition.

The barrier layer 130 may enable high tunneling magnetoresistance when combined with the reference layers 126 or 128 and the free layer 132. The barrier layer 130 may include an insulating material, such as magnesium oxide (MgO) or aluminum oxide ($Al_xO_{1-x}$).

The free layer 132 is a magnetic switchable layer that enables tunneling magnetoresistance when combined with the reference layers 126 or 128 and the barrier layer 130. The free layer 132 may include, for example, FeCoB alloys of varying composition. To enable high TMR, a seedlayer (not shown) may be included between the free layer 132 and the insulating layer 113 that dictates the crystallographic orientation of the magnetic portion of the free layer 132. The seedlayer may include materials such as tantalum (Ta), tungsten (W), or titanium (Ti).

The read path 106 may include magnetic synthetic anti-ferromagnetic (SAF) layers 134. The (SAF) layers 134 may be used to pin the reference layers 126 and 128 of the MTJs to fix the magnetization direction of the reference layers 126 and 128. The SAF layers 134 may include alternating layers of magnetic metals and non-magnetic metals, where the magnetic metals have alternating magnetic orientations (i.e., anti-ferromagnetic coupling). The SAF layers 134 may include, for example, cobalt (Co) alloy magnetic layers separated by non-magnetic ruthenium (Ru) spacer layers. The SAF layers 134 may also include an intrinsically anti-ferromagnetic material such as manganese iridium (MnIr) or platinum manganese (PtMn). The magnetization directions shown in the SAF layers 134 and the reference layers 126 and 128 may be reversed without affecting the overall behavior of the device 100. A capping layer may be included between the SAF layers 134 and the reference layer 126 and between the SAF layers 134 and the reference layer 128. The capping layer may include materials such as tantalum (Ta), tungsten (W), or titanium (Ti).

In some implementations, the read path 106 may include a giant magnetoresistive (GMR) sensor in place of the MTJs. The GMR sensor includes a conductive spacer, instead of a tunnel barrier, between the free layer and the reference layer.

The write path 112 includes a magnetic layer 118 between the write path terminals 108 and 110. The write path terminals 108 and 110 may be any suitable electrically conductive material, such as gold (Au), silver (Ag), platinum (Pt), copper (Cu), tungsten (W), aluminum (Al), or a combination of materials.

The magnetic layer 118 may include one or more films (stacked on top of each other) that have a net magnetic moment. The magnetic layer 118 may be positioned between normal metal or oxide interfaces (e.g., Pt/Co/$AlO_x$, Ta/CoFeB/MgO). The magnetic layer 118 includes at least one magnetic material and may include one or more additional sub-layers, such as additional magnetic layers or non-magnetic seedlayers. For example, the magnetic layer 118 may include an underlayer, a capping layer, or both. In some implementations, the underlayer may have an induced magnetic moment due to interaction with a switchable magnetic layer positioned adjacent to the underlayer.

For example, in FIG. 1, the magnetic layer 118 includes a seed/adhesion layer 120, a spin-orbit torque seedlayer 122, and a switchable magnetic layer 124. The seed/adhesion layer 120 may aid in developing appropriate crystallographic texture of subsequent layers and/or promoting sufficient adhesion to the write path terminals 108 and 110. The seed/adhesion layer 120 may include materials such as Ta, W, or Ti.

The spin-orbit torque seedlayer 122 may promote switching of the switchable magnetic layer 124 via spin-orbit torques (e.g., via the Rashba Effect or the Spin Hall Effect). When a current is applied to the write path terminals 108 and 110, the current may flow through the spin-orbit torque seedlayer 122 to promote switching of the switchable magnetic layer 124. The spin-orbit torque seedlayer 122 may be any suitable metal material with strong spin-orbit coupling and/or a large spin-hall angle. Examples of such metal material include Pt, Pd, W, Ta, or Ir.

The switchable magnetic layer 124 has a single magnetization domain such that a magnetization direction of the switchable magnetic layer 124 is uniform or the same throughout the magnetic layer 124 when the device 100 is in steady state. The switchable magnetic layer 124 can include any suitable magnetic material, such as iron (Fe), cobalt (Co), nickel (Ni), or any alloy combination. Other examples of suitable magnetic material include $Ni_{81}Fe_{19}$ (Permalloy) or FeCoB. The switchable magnetic layer 124 may include multiple layers of these materials (see, e.g., FIG. 4).

The electrically insulating layer 113 promotes electrical isolation between the read path 106 and the write path 112 such that no substantial flow of current occurs between the read path 106 and the write path 112. The insulating layer 113 promotes magnetic coupling of the read path 106 to the write path 112. The electrically insulating layer 113 may be any suitable insulating material that enables magnetic interaction between the magnetic layer 118 and the free layer 132 so that free layer 132 switches in response to the magnetic layer 118 switching. The insulating layer 113 may include a magnetic material or a non-magnetic material.

This magnetic interaction could be enabled through direct magnetic exchange interactions via a magnetic insulating layer or through magnetostatic interactions via a non-magnetic insulating layer. Example insulating materials that enable direct magnetic exchange include magnetically ordered oxides of Fe, Ni, Co, or a combination, such as $Fe_xO_{1-X}$ or $(Fe_YCo_{1-y})_XO_{1-x}$. Non-magnetic oxides, e.g., $Al_XO_{1-X}$ or MgO, can be used for coupling obtained primarily through magnetostatic interactions.

Stacked in-plane magnetic materials have a natural preference to align antiparallel to maximize flux closure and minimize magnetostatic energy. A non-magnetic insulating layer separating the read path 106 and write path 112 can still accommodate maximized flux closure and minimized magnetostatic energy. However, a non-magnetic insulating layer may not mediate strong exchange coupling, which may help stabilize the resistance state of the device 100.

Magnetization of the magnetic layer 118 couples to the free layer 132 in the read path 106 through the insulating layer 113. The orientation of magnetization of the magnetic layer 118 determines a resistance between the read terminals 102 and 104. The write operation of the device 100 is based on spin-orbit coupling mechanisms that induce a torque on the magnetization of the magnetic layer 118. Application of a current to the write terminals 108 and 110 leads to spin-orbit torques, which reorient the magnetization direction of the magnetic layer 118. Examples of such spin-orbit torques include the Rashba effect and the spin Hall effect. For the Rashba effect, a pulsed current applied to a structurally asymmetric material system produces an effective magnetic field orthogonal to the current direction. For the spin Hall effect, scattering in a nonmagnetic metal (e.g., Pt, Ta, W) leads to a net flux of polarized spins to an interface with a magnetic material that can alter that material's magnetization state. Regardless of the precise mechanism, the device behavior is identical in that a current through the write path 112 causes the magnetization of the magnetic layer 118 to orient "into the page" or "out of the page," as shown in FIG. 1. In some implementations, the current flows through the switchable magnetic layer 124. In some implementations, the current flows through the spin-orbit torque seedlayer 122. The direction of the current determines the direction of magnetization of the magnetic layer 118 and the final magnetization state of the device 100. Bias magnetic fields may be used to assist switching of the direction of magnetization.

Figure 2:
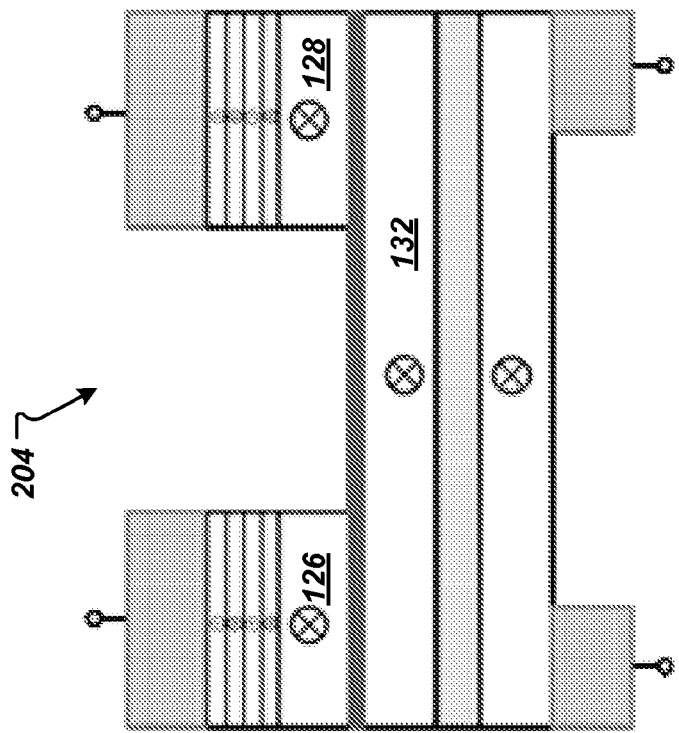
FIG. 2 shows examples of logic states of the nonvolatile magnetic logic device of FIG. 1 with ferromagnetic coupling.
Figure 2:
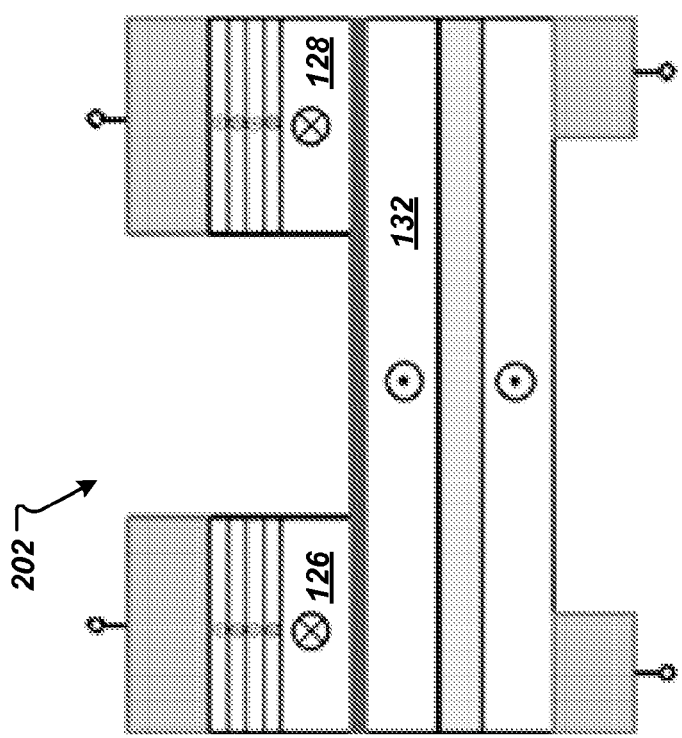

As discussed above, the magnetization of the magnetic layer 118 of the write path 112 couples to the free layer 132 of the read path 106. Therefore, the direction of current in the write path 112 determines if the device 100 enters a high resistance state or low resistance state, where the high resistance state has a higher resistance relative to the low resistance state. FIG. 2 shows examples of logic states 202 and 204 of the nonvolatile magnetic logic device 100 of FIG. 1 with ferromagnetic coupling. In FIG. 2, the device 100 is in a high resistance state 202 when the magnetization of the free layer 132 is antiparallel (or opposite in direction) to the magnetization of the reference layers 126 and 128, and in a low resistance state 204 when the magnetization of the free layer 132 is parallel to (or in the same direction as) the reference layers 126 and 128.

Figure 3:
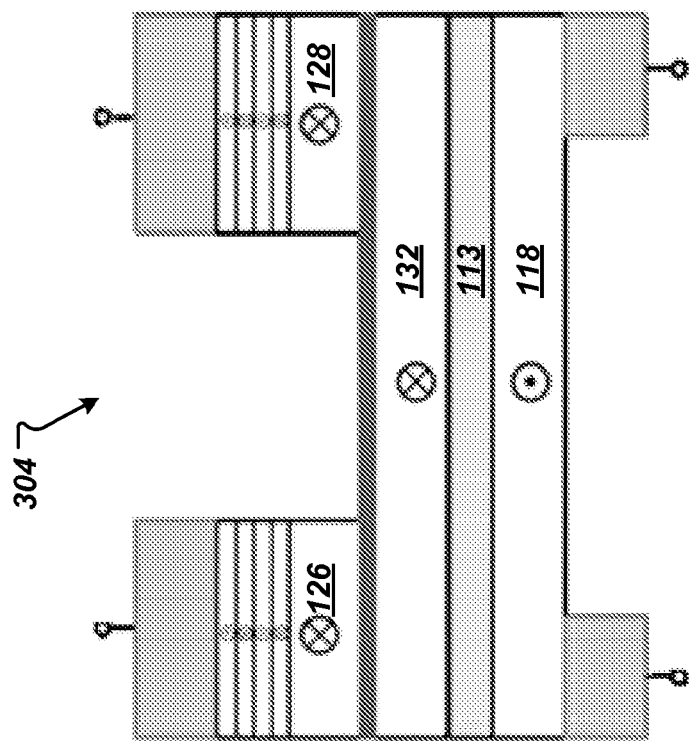
FIG. 3 shows examples of logic states of the nonvolatile magnetic logic device of FIG. 1 with antiferromagnetic coupling.
Figure 3:
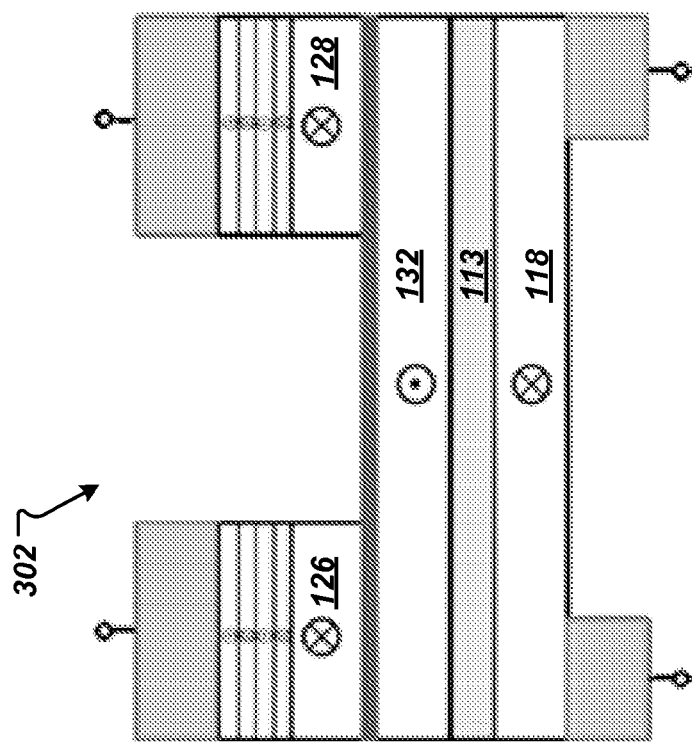

Because the magnetization of the device 100 is in-plane along the width direction, the resistance states may be more stable when the flux closure is high. This occurs when opposite poles of the layers are closer together. To accommodate this, the coupling through the insulating layer 113 may be antiferromagnetic in nature. FIG. 3 shows examples of logic states 302 and 304 of the nonvolatile magnetic logic device 100 of FIG. 1 with antiferromagnetic coupling. For antiferromagnetic coupling, the magnetization of the free layer 132 aligns antiparallel (or opposite in direction) to that of the magnetic layer 118 during and after programming of the device 100. This may improve the stability of the device 100. In FIG. 3, the device 100 is in a high resistance state 302 when the magnetization of the free layer 132 is antiparallel (or opposite in direction) to the magnetization of the reference layers 126 and 128, and in a low resistance state 304 when the magnetization of the free layer 132 is parallel to (or in the same direction as) the reference layers 126 and 128.

Figure 4:
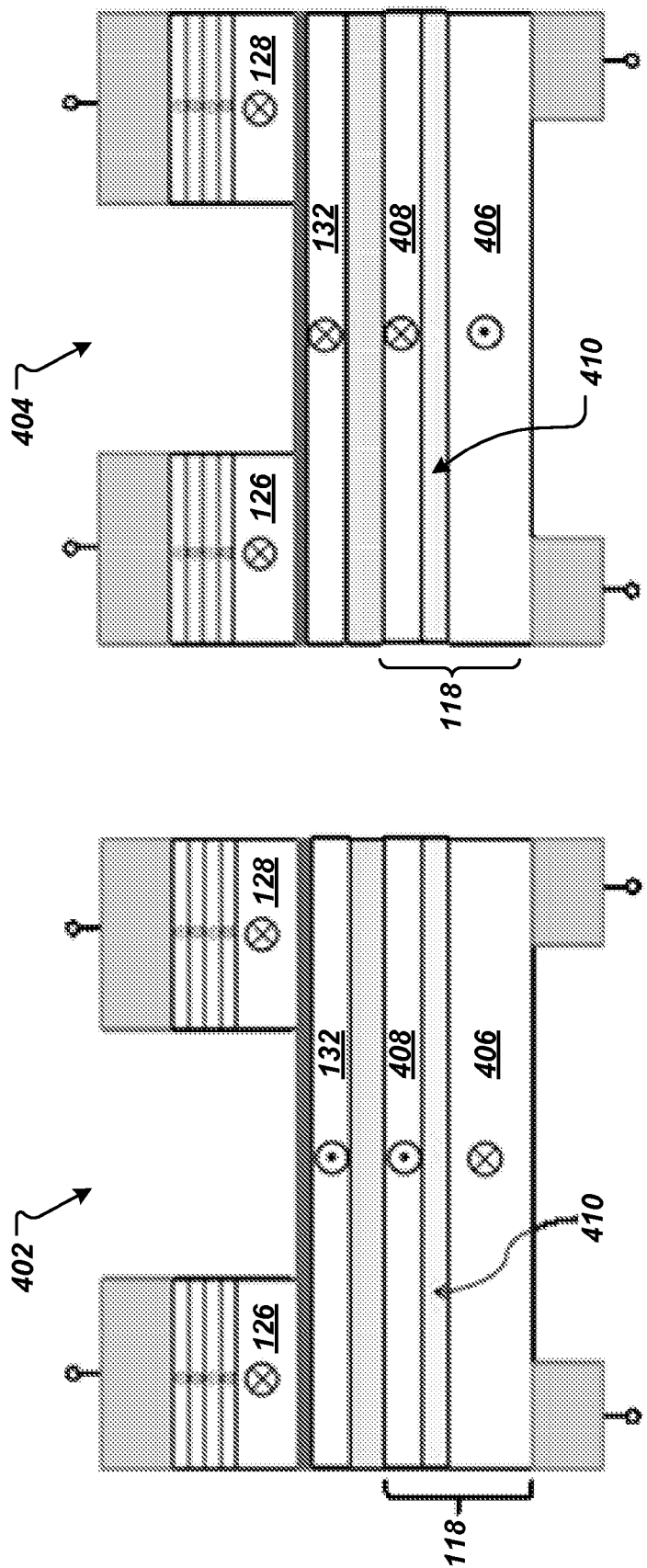
FIG. 4 shows examples of logic states of a nonvolatile magnetic logic device with a magnetic layer having multiple sub-layers.

In some implementations, the stability of the device 100 may be improved by making the magnetic layer 118 a bilayer or multilayer structure. FIG. 4 shows examples of logic states 402 and 404 of the nonvolatile magnetic logic device 100 of FIG. 1 with the magnetic layer 118 having multiple sublayers 406, 408, and 410. The bottom component 406 of the magnetic layer 118 may be thicker than the top component 408, as well as the read path free layer 132. A thin conductive spacer 410 separates the two components 406 and 408, such that current in the write path flows through both components 406 and 408 of the magnetic layer 118. The components 406 and 408 may magnetize in opposite directions. A thicker bottom component 406 may yield a high flux closure and may result in greater stability of the device 100. The term "bilayer" does not necessarily indicate only two material films in the magnetic layer 118, but may indicate two stacks of films that may include a shared layer (e.g., Pt/Co/Ta/Co/Pt). In FIG. 4, the device 100 is in a high resistance state 402 when the magnetization of the free layer 132 is antiparallel (or opposite in direction) to the magnetization of the reference layers 126 and 128, and in a low resistance state 404 when the magnetization of the free layer 132 is parallel to (or in the same direction as) the reference layers 126 and 128.

Figure 5:
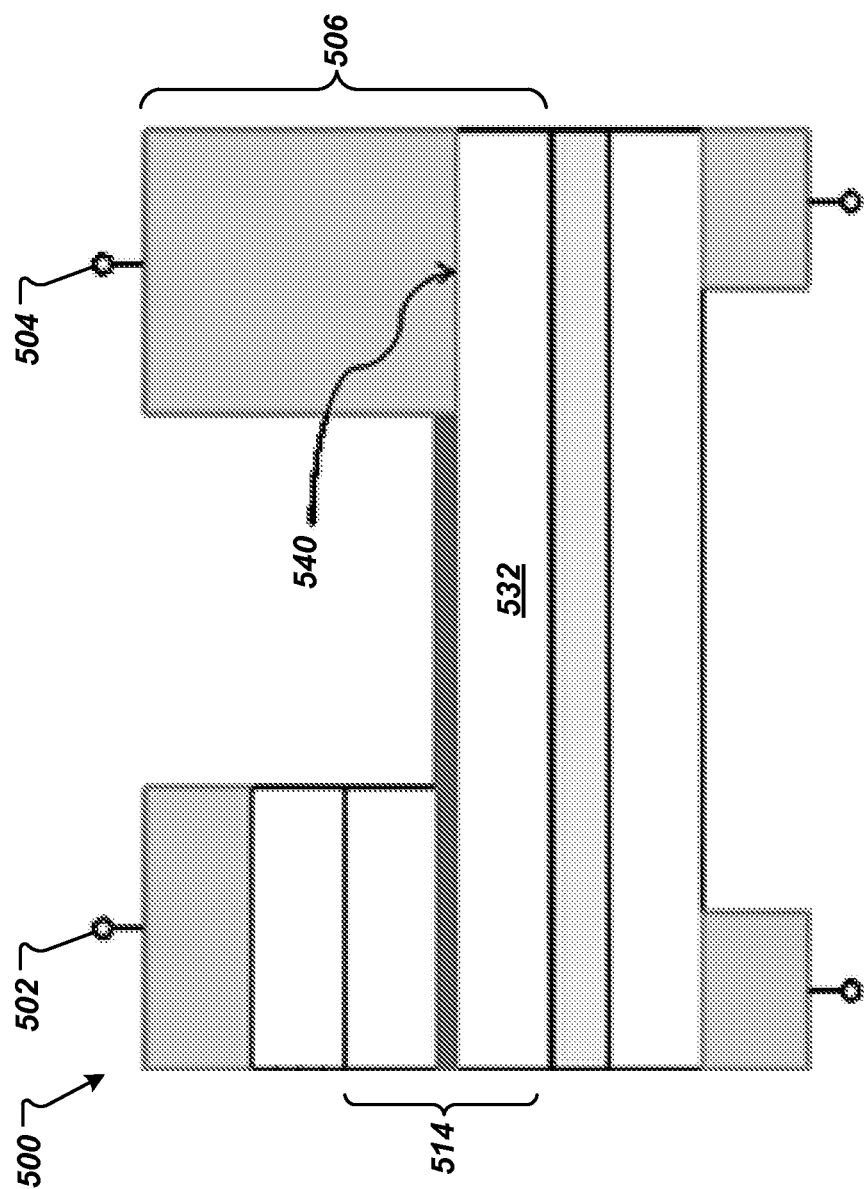
FIG. 5 shows an example of a nonvolatile magnetic logic device with a read path having one magnetic tunnel junction.

In some implementations, a nonvolatile magnetic logic device may include a read path with one magnetic tunnel junction. FIG. 5 shows an example of a nonvolatile magnetic logic device 500 with a read path 506 having one MTJ 514. A read path 506 with one MTJ 514 may lower the series resistance of the read path 506 as compared to a read path with two MTJs (as shown in FIGS. 1-4). For some applications, it may be beneficial to have a smaller resistance between the read terminals 502 and 504 as compared to the resistance between read terminals 102 and 104 of FIGS. 1-4. By etching through or shorting the MTJ on one read terminal, the read path 506 may be formed to include one MTJ 514. The contact 540 between the read terminal 504 and the free layer 532 of the read path 506 is ohmic, with no tunnel barrier between the two metals of the read terminal 504 and the free layer 532.

Figure 6:
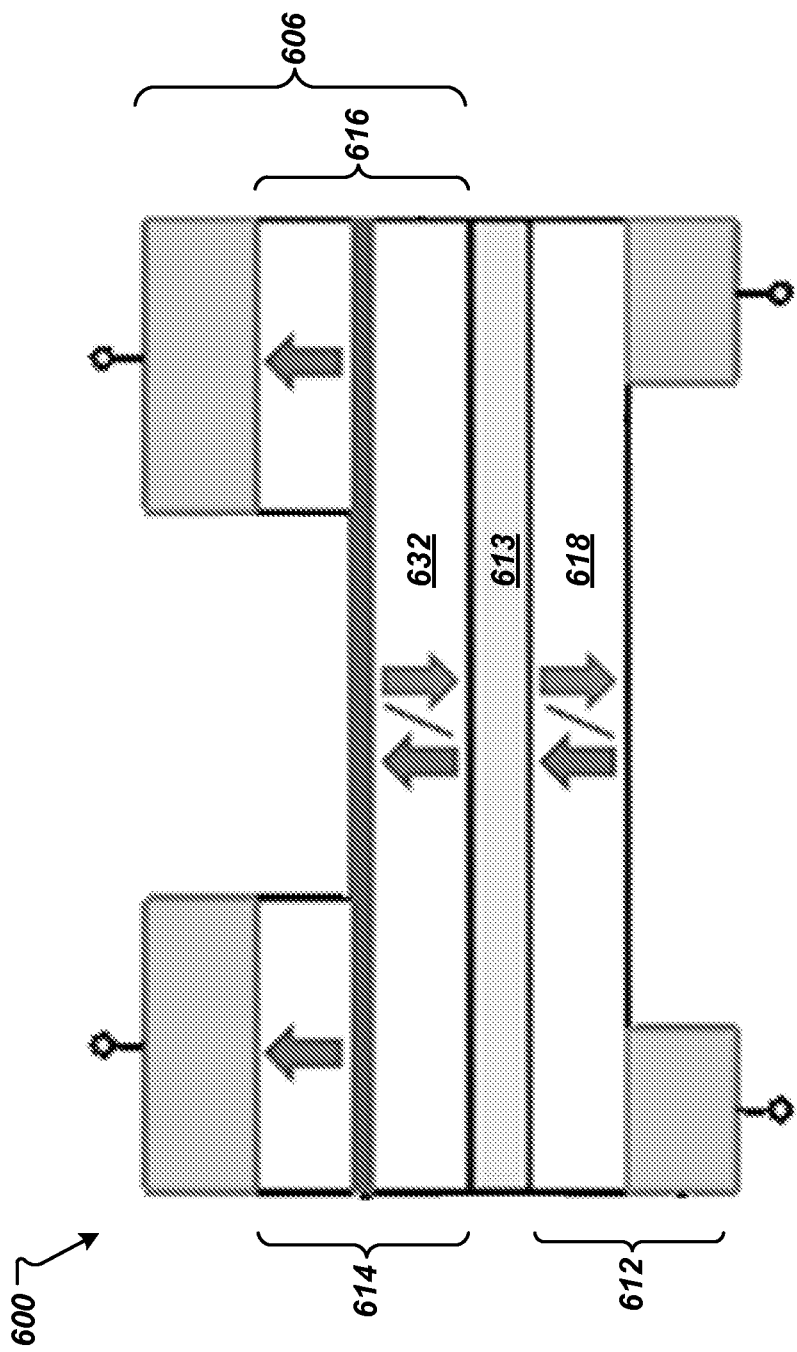
FIG. 6 shows an example of a nonvolatile magnetic logic device with perpendicular magnetic anisotropy.

In some implementations, a nonvolatile magnetic logic device may have a perpendicular magnetization switched by spin-orbit torques. FIG. 6 shows an example of a nonvolatile magnetic logic device 600 with perpendicular magnetic anisotropy, where the direction of magnetization is perpendicular to the plane of the device 600, e.g., either pointing upward or downward in FIG. 6. The magnetization of all the magnetic layers may be naturally-oriented perpendicular to the film plane. In some material systems, a very strong perpendicular anisotropy may be achieved, which enhances the stability of the magnetization state and scaling the devices to smaller sizes may be possible.

The device 600 may include layers similar to the layers described above for device 100 of FIGS. 1-4. Structurally, the device 600 is similar to the device 100 in that a write path 612 includes a magnetic layer 618 positioned between metal and/or oxide interfaces (e.g., Pt/Co/AlOx, Pt/Co/Pt, Ta/CoFeB/MgO, Pt/Co/Ta, etc.) and is magnetically-coupled to a free layer 632 of a MTJs 614 and 616 of a read-path 606 through an insulating layer 613. In some implementations, the magnetic layer 618 may include a bilayer or multilayer structure, similar to the device 100 shown in FIG. 4.

In some implementations, the device 600 may include a non-magnetic insulating layer in place of a magnetic insulating layer. In this case, the coupling between read path 606 and write path 612 is magnetostatic in nature. Bias magnetic fields may be used to assist switching.

In some implementations, the device 600 may include a read path with one MTJ, similar to the device 500 shown in FIG. 5. A device 600 with only one MTJ in the read path 606 may lower the series resistance of the device 600 as compared to the series resistance of the device 600 with two MTJs.

Similar to the device 100 of FIGS. 1-4, the insulating layer 613 may promote ferromagnetic (parallel) or antiferromagnetic (antiparallel) exchange coupling. The antiferromagnetic coupling may not enhance stability by promoting flux closure, as in the device 100, but is still a viable option for the device 600.

Figure 7:
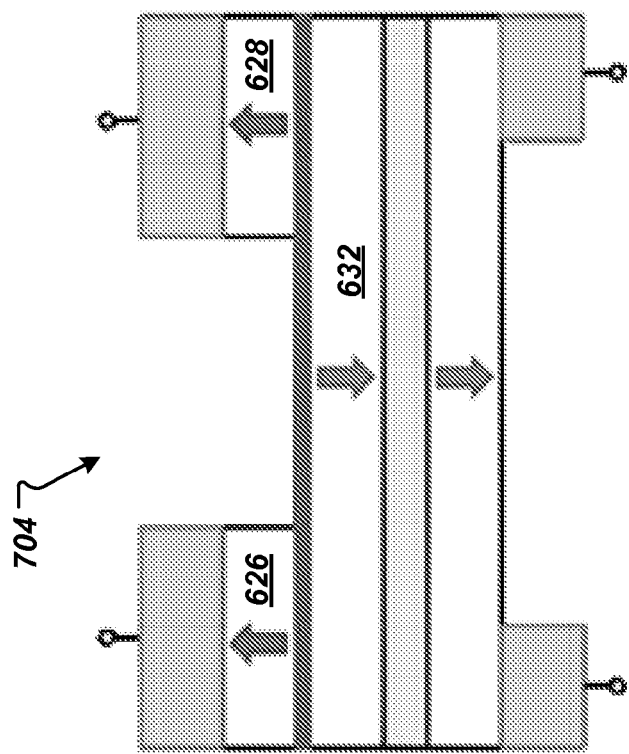
FIG. 7 shows examples of logic states of the nonvolatile magnetic logic device of FIG. 5 with ferromagnetic coupling.
Figure 7:
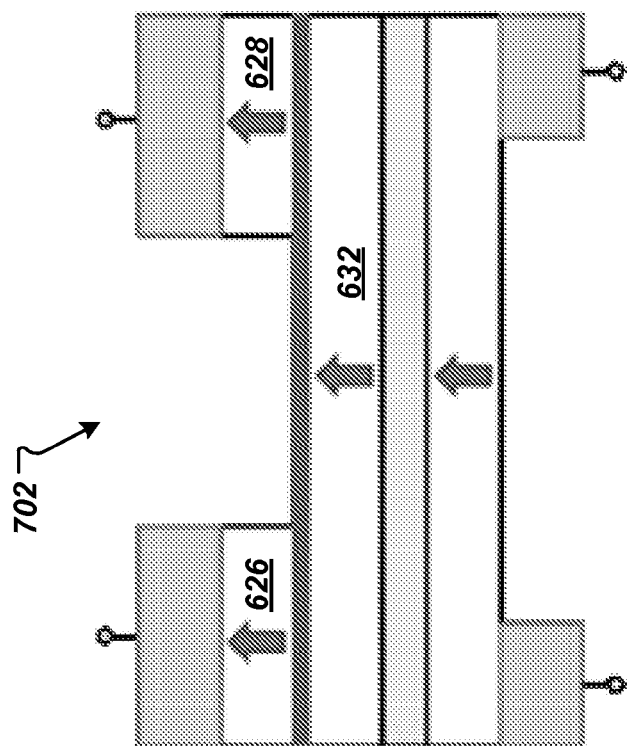

FIG. 7 shows examples of logic states 702 and 704 of the nonvolatile magnetic logic 600 device of FIG. 6 with ferromagnetic coupling. In FIG. 7, the device 600 is in a high resistance state 702 when the magnetization of the free layer 632 is antiparallel (or opposite in direction) to the magnetization of the reference layers 626 and 628, and in a low resistance state 704 when the magnetization of the free layer 632 is parallel to (or in the same direction as) the reference layers 626 and 628.

Figure 8:
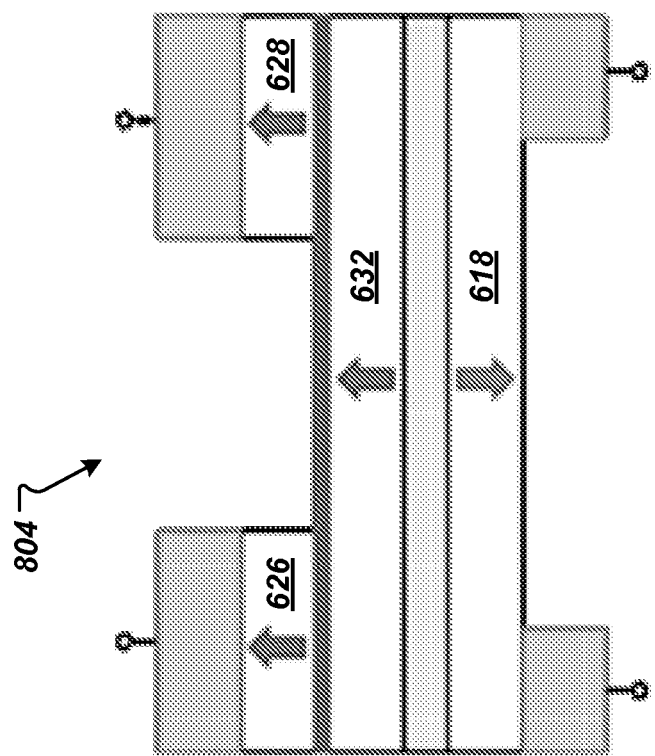
FIG. 8 shows examples of logic states of the nonvolatile magnetic logic device of FIG. 5 with antiferromagnetic coupling.
Figure 8:
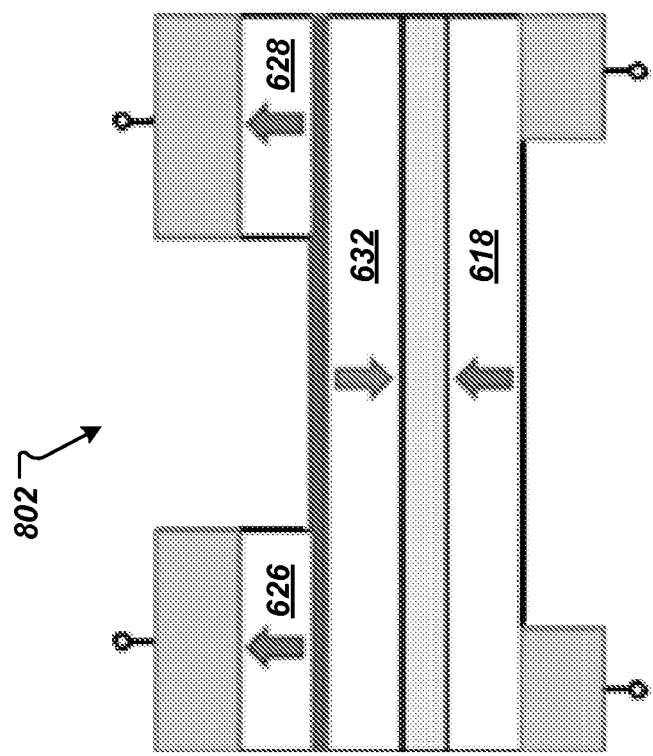

FIG. 8 shows examples of logic states 802 and 804 of the nonvolatile magnetic logic device 600 of FIG. 6 with antiferromagnetic coupling. For antiferromagnetic coupling, the magnetization of the free layer 632 aligns antiparallel (or opposite in direction) to that of the magnetic layer 618 during and after programming of the device 600. In FIG. 8, the device 600 is in a high resistance state 802 when the magnetization of the free layer 632 is antiparallel (or opposite in direction) to the magnetization of the reference layers 626 and 628, and in a low resistance state 804 when the magnetization of the free layer 632 is parallel to (or in the same direction as) the reference layers 626 and 628.

In general, magnetization of a material does not "prefer" to lie along a given direction unless the material (or device) is engineered to define a preferred direction. The preferred direction of magnetization is referred to as anisotropy. Anisotropy defines the magnetization orientation(s) that yield low energy, relaxed states. The devices described above are referred to as having "in-plane" magnetization or "perpendicular" magnetization. "In-plane" magnetization describes an anisotropy in the plane of the material, and "perpendicular" magnetization describes an anisotropy that is perpendicular to the film plane of the material.

In-plane anisotropy may be established by controlling the shape of the device, which may also be referred to as "shape anisotropy." The device may be fabricated such that one dimension is longer than the other (e.g., a major axis is greater in length than a minor axis), and due to magnetostatic energy, the magnetization has a lower energy state when it is oriented along the longer axis. The device may be physically shaped to make a stable position for the magnetization. In devices that are scaled to very small sizes, it may be difficult to define preferred directions, and the energy barrier for flipping the magnetization direction (defined by the volume and anisotropy "strength") may become so small that the magnetization direction can flip randomly.

Perpendicular anisotropy is a film-level (or multilayer film-level) property. Perpendicular anisotropy is not set by the shape of the device, and so scaling to smaller sizes may be possible the material or device is engineered to have a strong anisotropy. Defining long axes versus short axes and their relative size difference may be less important in such devices.

In the cross-sections of the in-plane device 100 shown in FIGS. 1-4, the read-path between the two read terminals include two MTJs. The MTJs have to be defined and etched with a space between them for the device 100 to operate correctly. For a rectangular shaped device with each MTJ being x nanometers (nm) long, x nm of space between the MTJs is desired. The total length of the read path is now 3x. However, since the device 100 is based on in-plane anisotropy, the width of the device 100 may need to be bigger than 3x to make sure that state of the anisotropy is stable. For example, the device 100 may need to be 9x nm wide.

Figure 9:
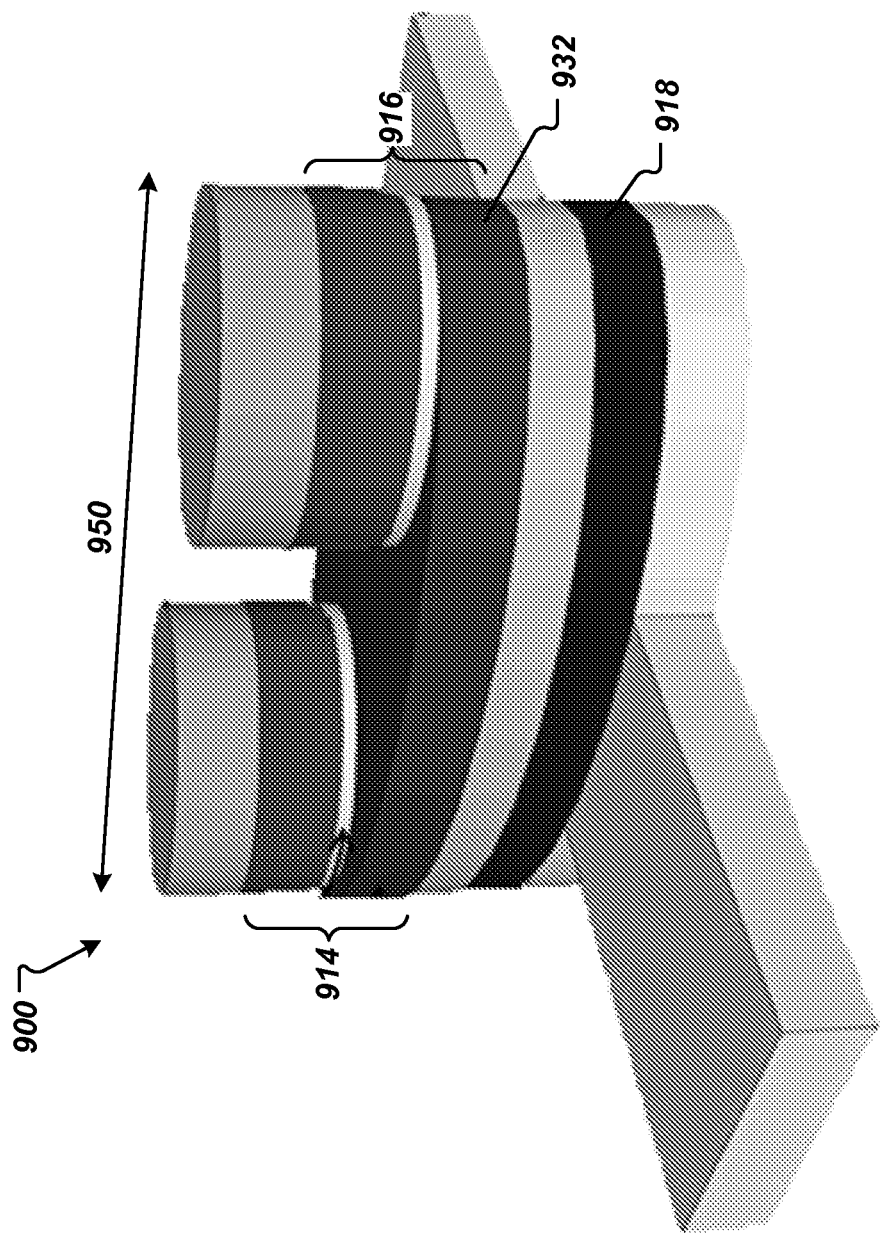
FIG. 9 shows a three dimensional view of an example of a nonvolatile magnetic logic device with an elliptical shape.

In some implementations, the nonvolatile magnetic logic device may have an elliptical shape where the write-path is rotated 90° with respect to the read-path. FIG. 9 shows a three dimensional view of an example of a nonvolatile magnetic logic device 900 with an elliptical shape. In some implementations, a transverse diameter (or major axis) of the magnetic layer 918 is substantially equal to a transverse diameter (or major axis) of the free layer 932, and a conjugate diameter (or minor axis) of the magnetic layer 918 is substantially equal to a conjugate diameter (or minor axis) of the free layer 932. In other implementations, the magnetic layer 918 and the free layer 932 may have different transverse and conjugate diameters. For the device 900, the long axis 950 and stable position of the magnetization is now along the same direction in which the MTJs 914 and 916 are defined and separated. In other words, the biggest dimension of the device is 3x. The elliptical device 900 may save space and energy compared to a non-elliptical device because the current flows through a smaller area, which may lead to more efficient switching.

Figure 10:
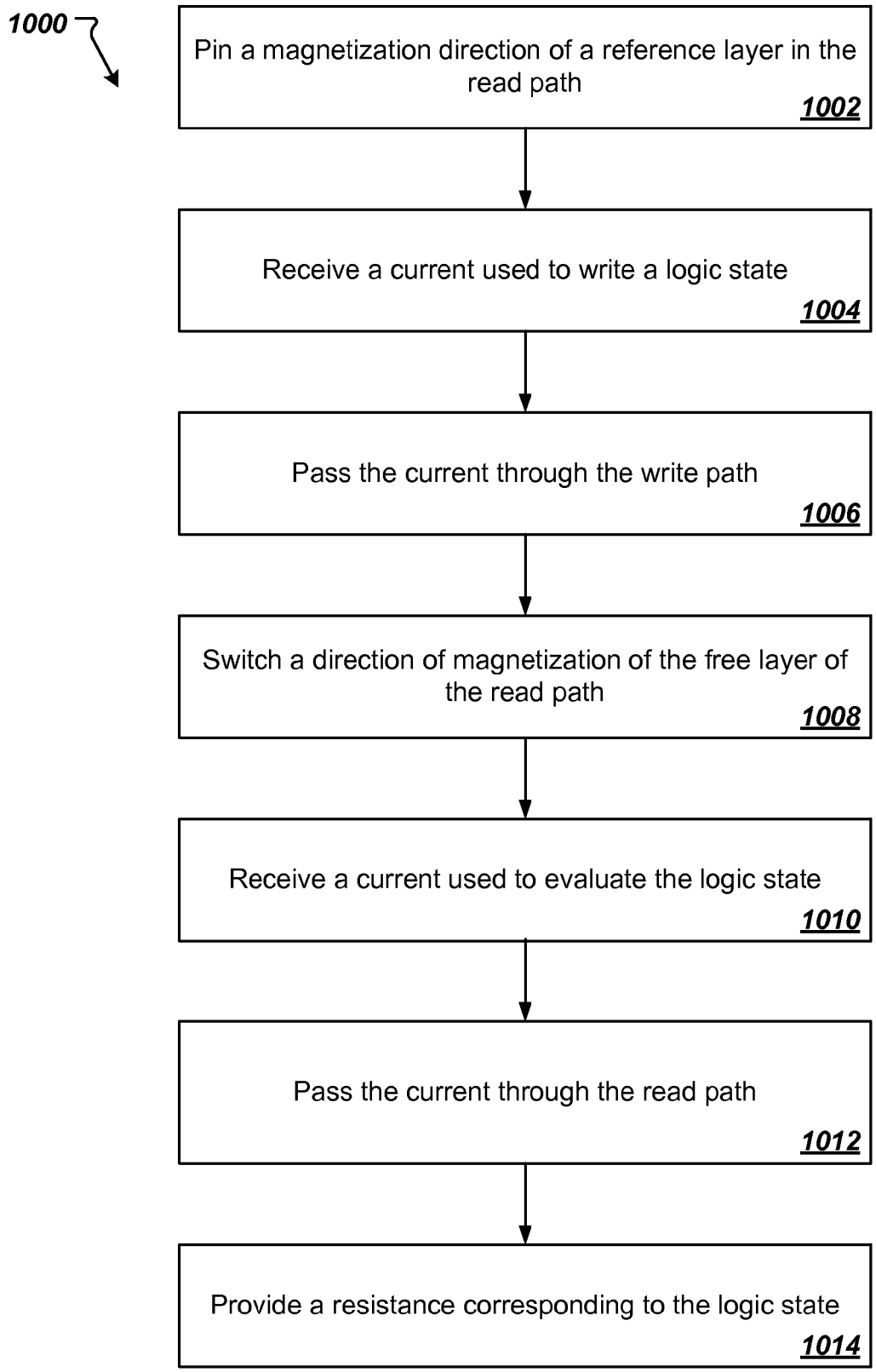
FIG. 10 is a flowchart of examples of operations performed by a nonvolatile magnetic logic device.
Figure 11:
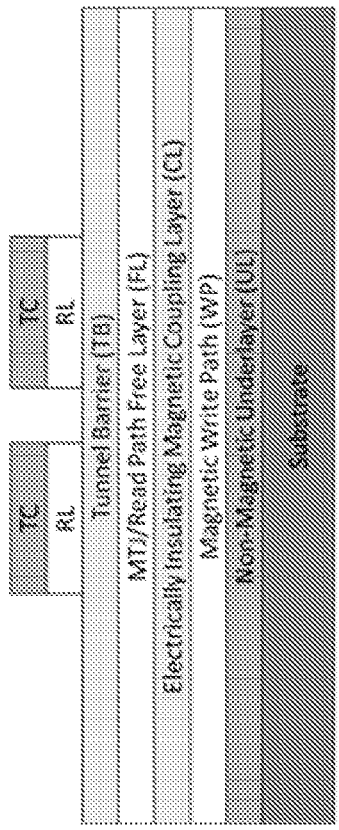
FIGS. 11-14 show side views of a nonvolatile magnetic logic device during different stages of fabrication.
Figure 11:
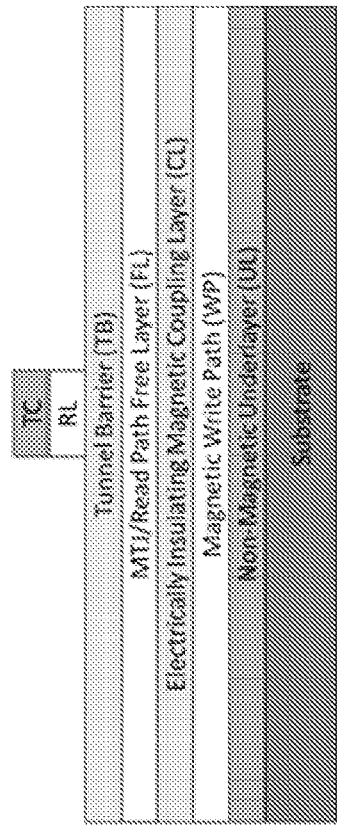
Figure 11:
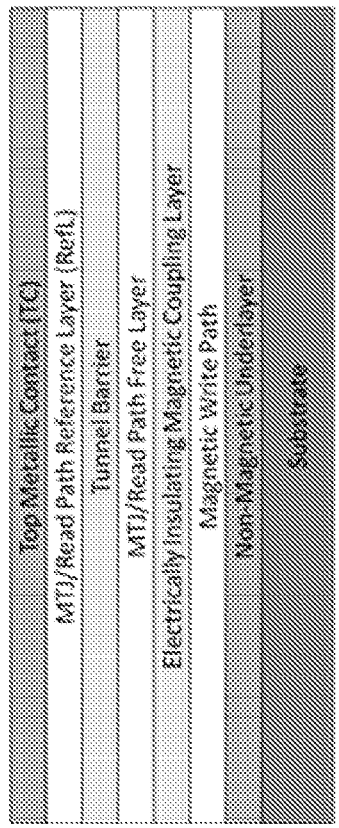
Figure 11:
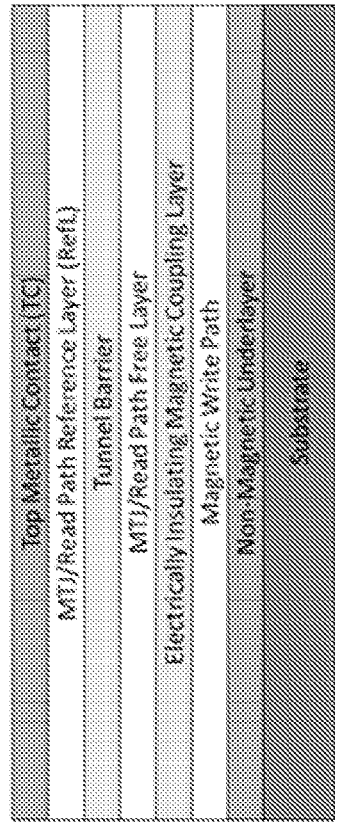
Figure 12:
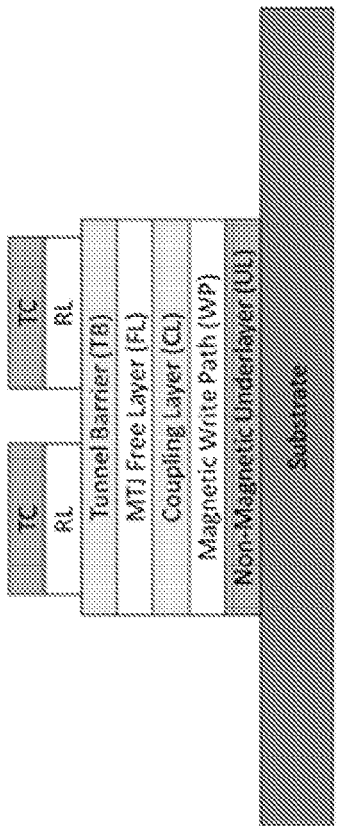
Figure 12:
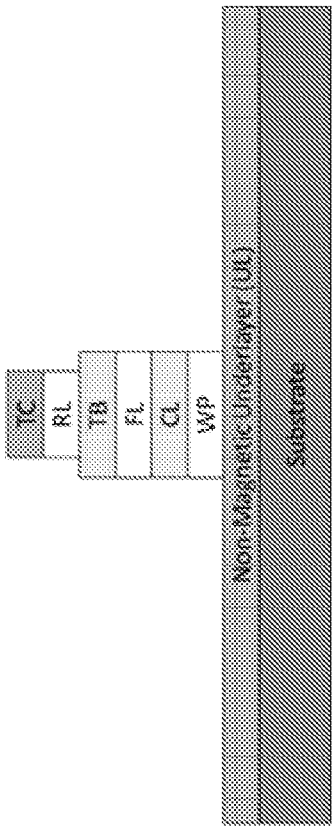
Figure 12:
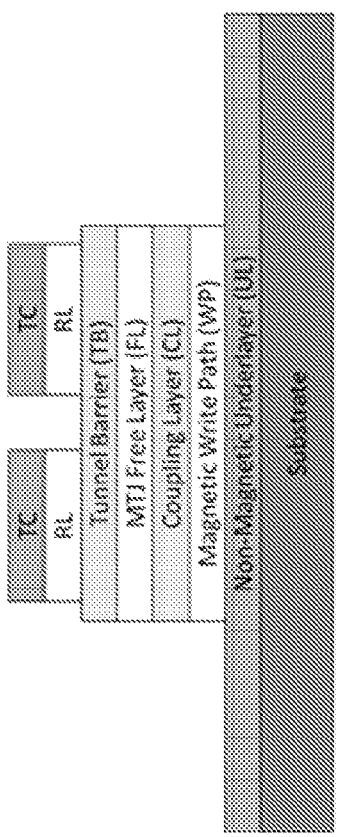
Figure 12:
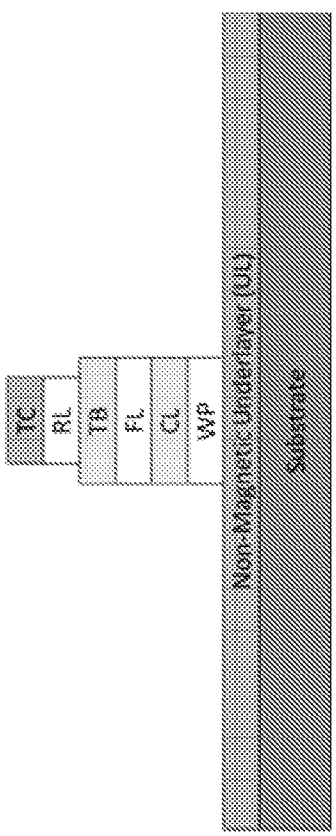
Figure 13:
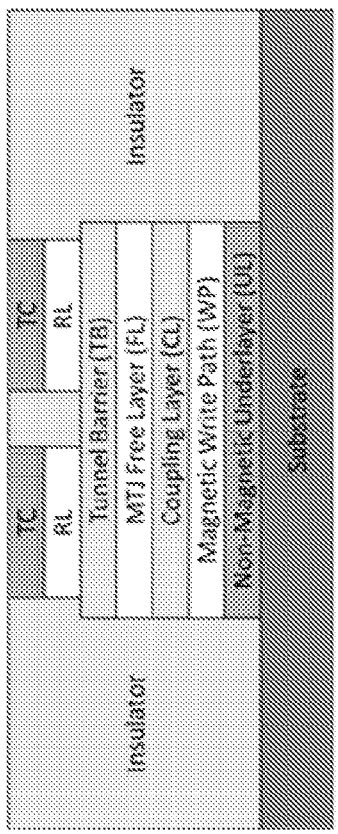
Figure 13:
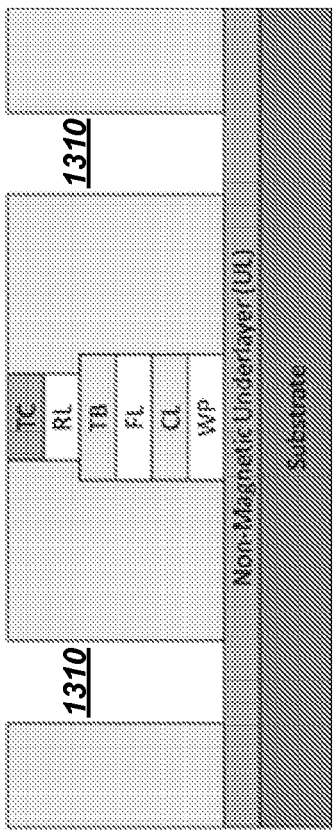
Figure 13:
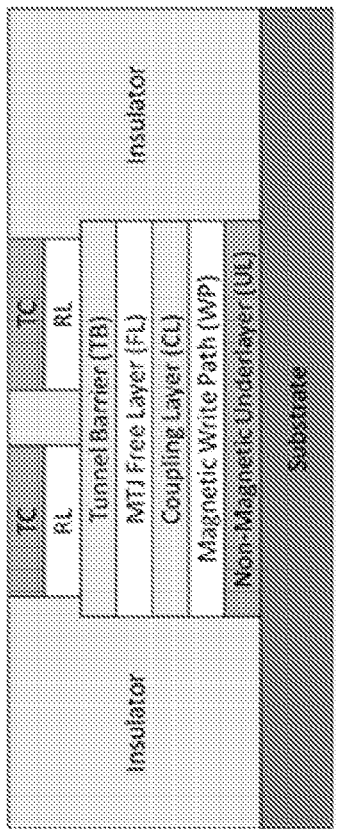
Figure 13:
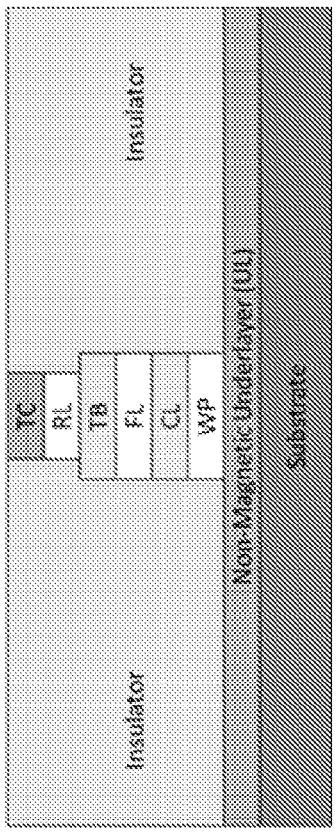
Figure 14:
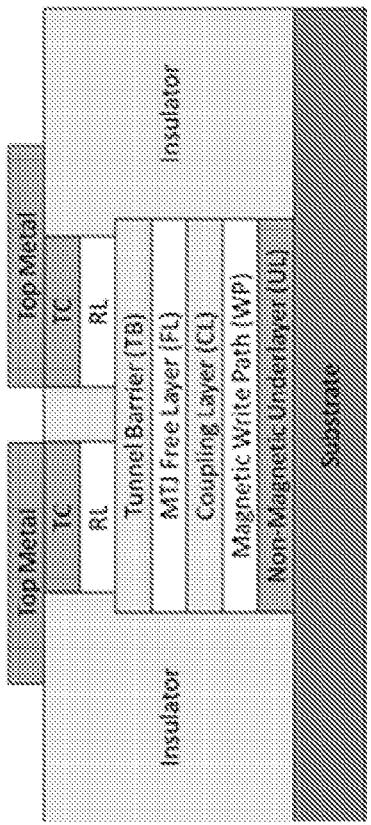
Figure 14:
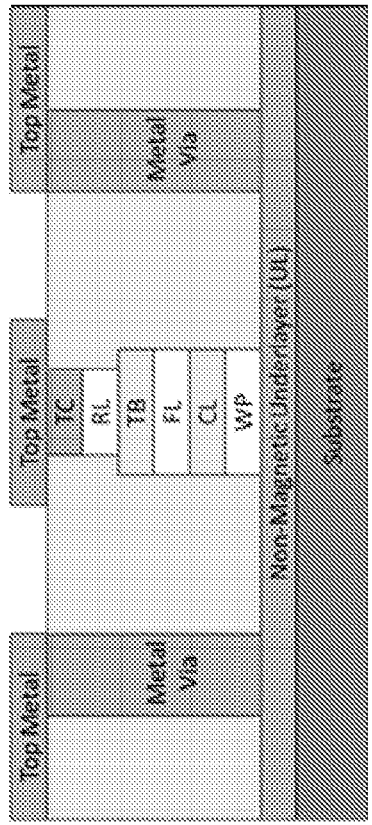
Figure 14:
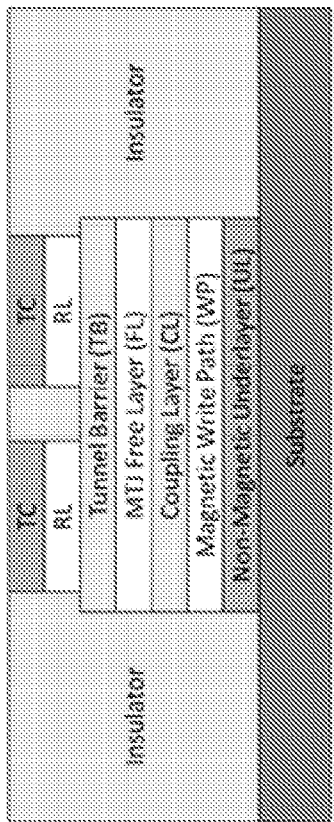
Figure 14:
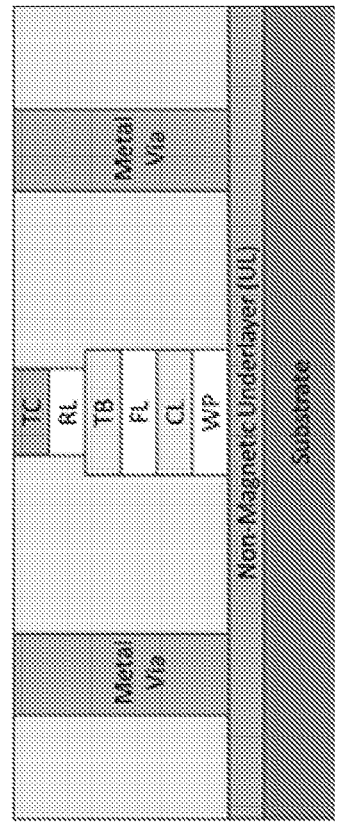

FIG. 10 is a flowchart of examples of operations performed by a nonvolatile magnetic logic device. At 1002, a fixed magnetization direction of the reference layer of the read path is pinned using a synthetic antiferromagnetic layer in the read path. At 1004, the device receives, via write path terminals of a write path, a current that is used to write a logic state to the nonvolatile magnetic logic device. The logic state may be written by applying a bias magnetic field in addition to the current.

At 1006, the current is passed through the write path terminals of the write path to control a direction of magnetization of a magnetic layer of the write path. The direction of magnetization is controlled by a direction of the current passing through the write path terminals. The direction of magnetization represents the logic state of the nonvolatile magnetic logic device. At 1008, a direction of magnetization of a free layer of the read path is switched with the direction of magnetization of the magnetic layer of the write path to cause the provided resistance to switch between a first resistance and a second resistance corresponding to the logic state.

At 1010, the device receives, via the read path terminals of the read path, a second current for evaluation of the logic state. At 1012, the second current is passed through the plurality of read path terminals, a reference layer, a tunnel barrier, and a free layer of the read path. At 1014, a resistance corresponding to the logic state of the nonvolatile magnetic logic device is provided, by the read path terminals, for evaluation of the logic state. A first resistance is provided when a direction of magnetization of the free layer of the read path is substantially parallel to a direction of magnetization of the reference layer of the read path. A second resistance is provided when the direction of magnetization of the free layer of the read path is substantially antiparallel to the direction of magnetization of the reference layer of the read path.

A nonvolatile magnetic logic device as described herein may use less energy while accommodating faster switching times than other logic devices. For a nonvolatile magnetic logic device initially in high resistance state, the magnetizations of the write path and the read path switch concurrently (or at roughly the same time, e.g., with a picosecond to nanosecond scale delay in the read path switching as the write path is programmed with a current pulse) once current is applied to the write terminals. For a current density of 10 MA/cm$^2$ (with a write path having a 2 nm thickness and 40 nm width, implying a current of 8 µA), the logic state switching process may be completed in 213 ps, indicative of a nonvolatile logic device that can be clocked at high speeds with low energy consumption.

FIGS. 11-14 show side views of a nonvolatile magnetic logic device during different stages (a)-(h) of fabrication. In stage (a), layers for entire film stack of the device are consecutively deposited using standard deposition techniques, such as sputter deposition, evaporation, molecular beam epitaxy. In stage (b), the top contact TC and MTJ reference layer RL are lithographically patterned (using, e.g., electron beam lithography or optical lithography) and etched (using, e.g., ion beam etching or reactive ion etching), stopping at or in the MTJ tunnel barrier TB. In stage (c), the MTJ tunnel barrier TB, the MTJ free layer FL, the insulating coupling layer CL, and the magnetic write path WP are lithographically patterned (using, e.g., electron beam lithography or optical lithography) and etched (using, e.g., ion beam etching or reactive ion etching), stopping at or in the non-magnetic underlayer UL. In stage (d), the non-magnetic underlayer UL is lithographically patterned (using, e.g., electron beam lithography or optical lithography) and etched (using, e.g., ion beam etching or reactive ion etching), stopping at or in the substrate. In stage (e), an insulating oxide or nitride (e.g., $SiO_x$, $SiN_x$, $AlO_x$, etc.) is deposited and planarized (using, e.g., chemical mechanical polishing) to expose the top contact TC. In stage (f), access vias 1310 to the non-magnetic underlayer UL are lithographically patterned (using, e.g., electron beam lithography or optical lithography) and etched (using, e.g., reactive ion etching). In stage (g), the vias are filled (using, e.g., sputter deposition or electroplating) with conductive metal (e.g., Cu, Au, Al, W) and planarized (using, e.g., chemical mechanical polishing). In stage (h), the conductive top metal electrodes (e.g., Cu, Au, Al) are deposited (using, e.g., sputter deposition), patterned (using, e.g., electron beam lithography or optical lithography), and etched (using, e.g., ion beam etching or reactive ion etching).

An application for the nonvolatile magnetic logic device exploits the bistable state (low resistance or high resistance) to build logic circuits. The implementations of the device, e.g., in-plane or perpendicular or switched by any of the spin-orbit torques, have the same "black box" representation of an input current controlling the resistance of an output path. The nonvolatile magnetic logic device can be configured into digital logic circuits with no integrated semiconductors. For example, the device may enable all-magnetic logic circuits capable of driving fanout. The device may increase the energy efficiency and switching speed of the circuits as compared to conventional logic devices.

Figure 15:
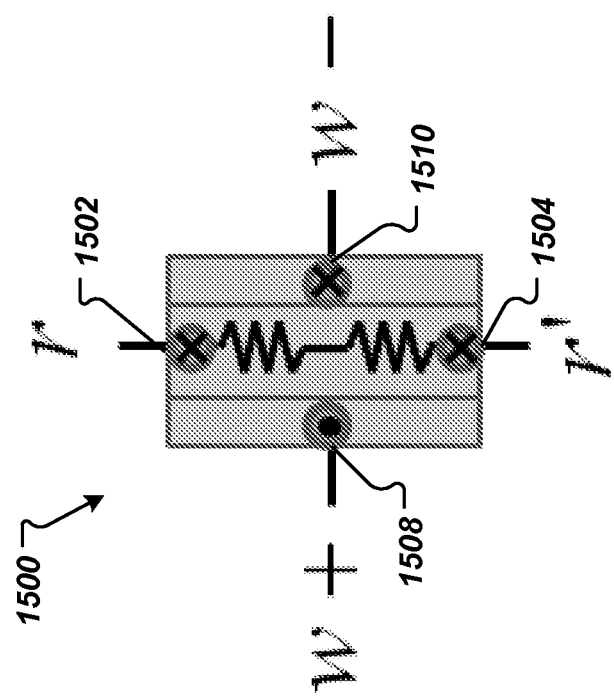
FIG. 15 shows a schematic representation of a nonvolatile magnetic logic device.

FIG. 15 shows a schematic representation 1500 of a nonvolatile magnetic logic device. The device can be schematically represented using the symbol 1500. Each terminal is labeled by a magnetization bubble. The read terminals 1502 and 1504 have fixed magnetization, while the bubbles on the write terminals 1508 and 1510 indicate the resulting direction of magnetization if the current enters that terminal For a current flow from w− to w+, the magnetization of the free layer will be parallel to magnetization of the read path reference layer, leading to a low resistance state. Similarly, a current flow from w+ to w− will program the magnetization of the free layer to be antiparallel to the magnetization of the read path reference layer and lead to a high resistance state. Although the magnetization bubbles seem to indicate the device magnetization anisotropy is in-plane, the bubbles are merely there for reference and equally well represent a perpendicularly-magnetized device because the "black box" behavior is identical. Because the switching ratios of MTJs are limited (considerably less than an order of magnitude), building circuits in the same way as when using CMOS transistors may not be feasible. A different approach to circuit design based on current steering is ideal, where signals are represented by currents.

Figure 16:
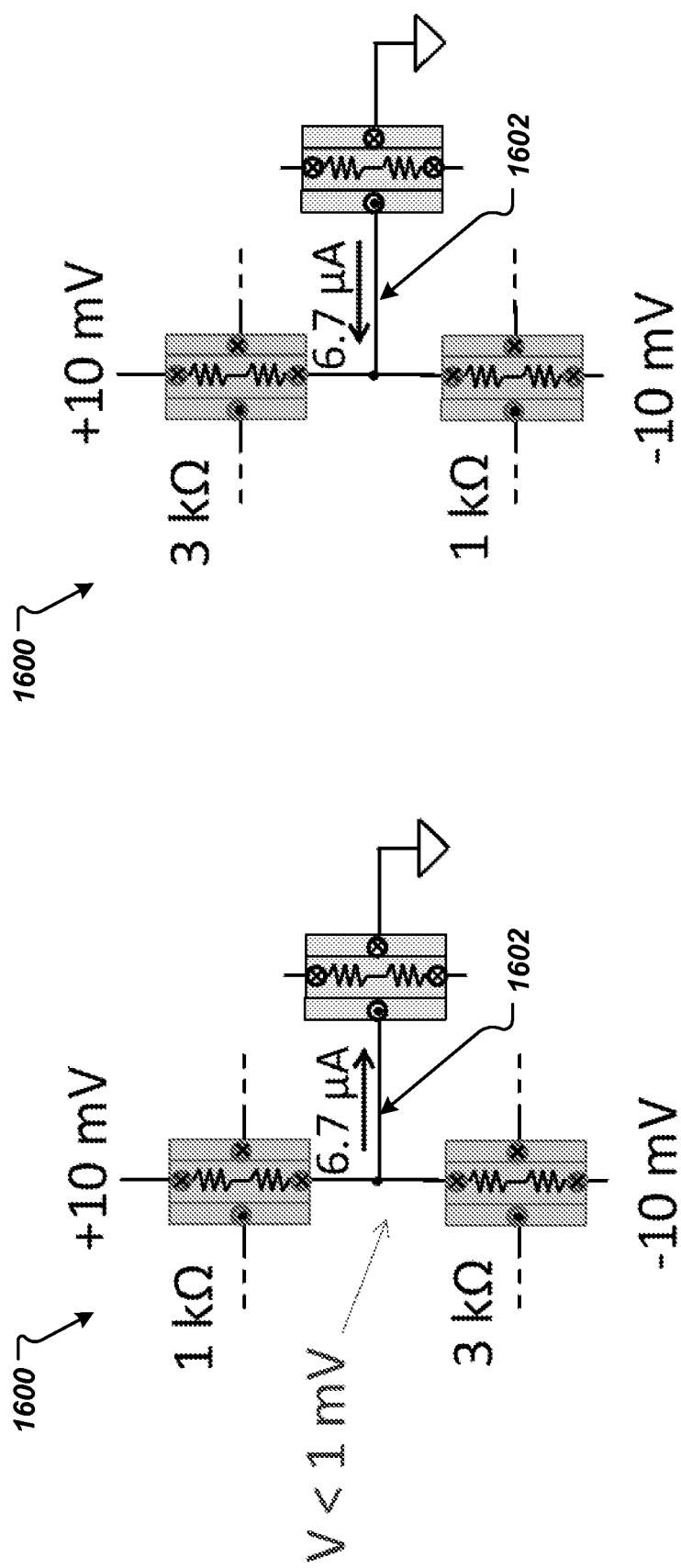
FIG. 16 shows a schematic representation of a buffer circuit using nonvolatile magnetic logic devices.

FIG. 16 shows a schematic representation of a buffer circuit 1600 using nonvolatile magnetic logic devices. In the buffer circuit 1600, the ratio of the pull-up to pull-down read path resistances (e.g., 1 kΩ to 3 kΩ or vice versa) steers a current into or out of a fanout write path 1602 when powered with matched positive and negative supply rails (e.g., +10 mV and −10 mV). The output current direction, not its magnitude, sets the logic state of the fanout device. Because the resistances are low and the required current is small, the circuit 1600 can be powered with ultra-low voltages.

Figure 17:
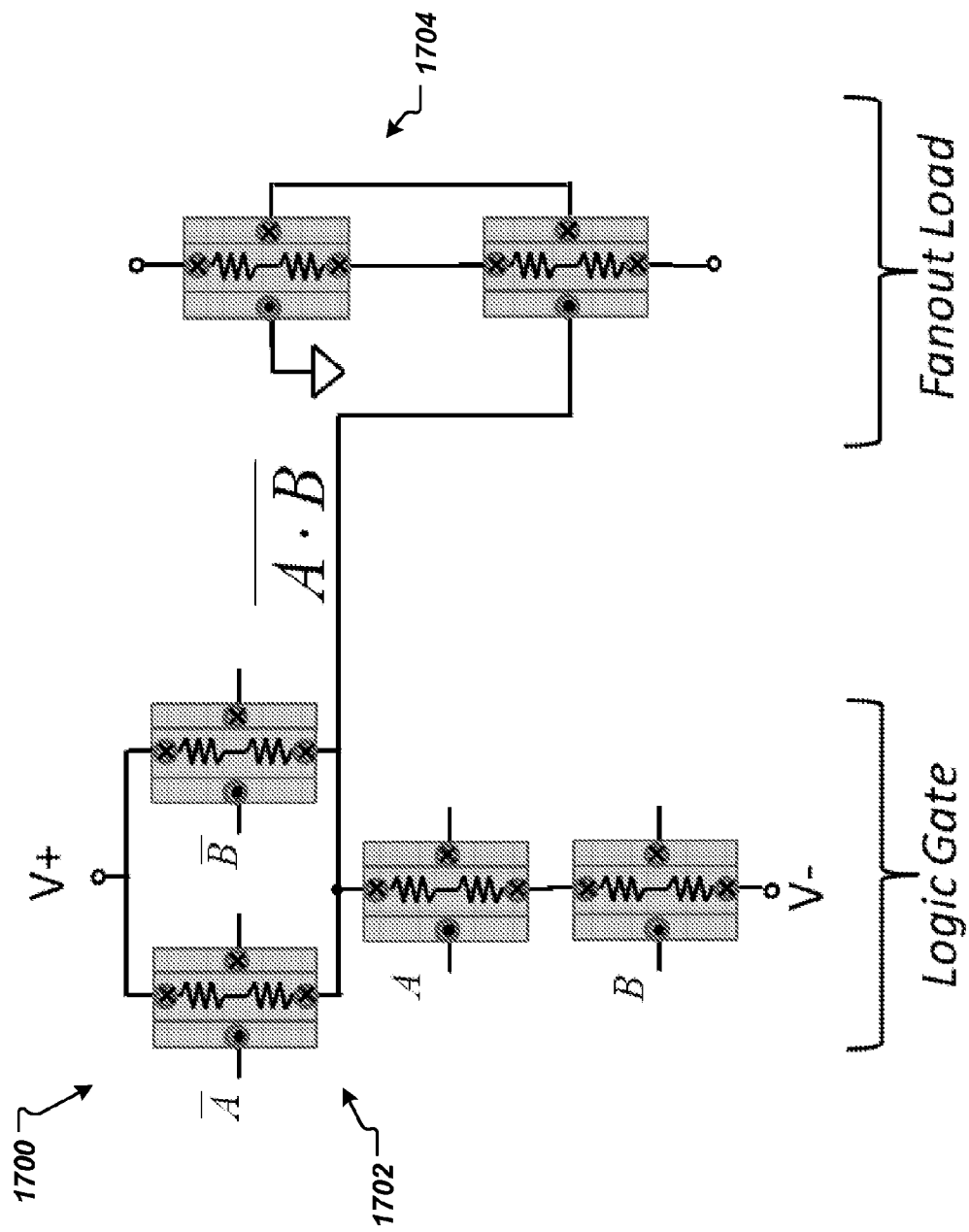
FIG. 17 shows a schematic representation of a circuit with two-input logic functions and its inverted counterpart using nonvolatile magnetic logic devices.

Two-input logic functions and their inverted counterparts can be configured using the nonvolatile magnetic logic devices. FIG. 17 shows a schematic representation of a circuit 1700 with two-input logic functions and its inverted counterpart using nonvolatile magnetic logic devices. In the circuit 1700, a NAND gate 1702 drives a fanout inverter 1704. The input signals A and B are currents (or more specifically, current directions), and the output signal is also a current. The current is steered through the write paths of both devices in the fanout inverter 1704, and because the direction of this current is opposite in the pull-up device compared to the pull-down device, the resistances will swing in opposite directions (giving an inversion). In the circuit 1700, the inversion is free, as current directions and power rail signs can be rewired.

Figure 18:
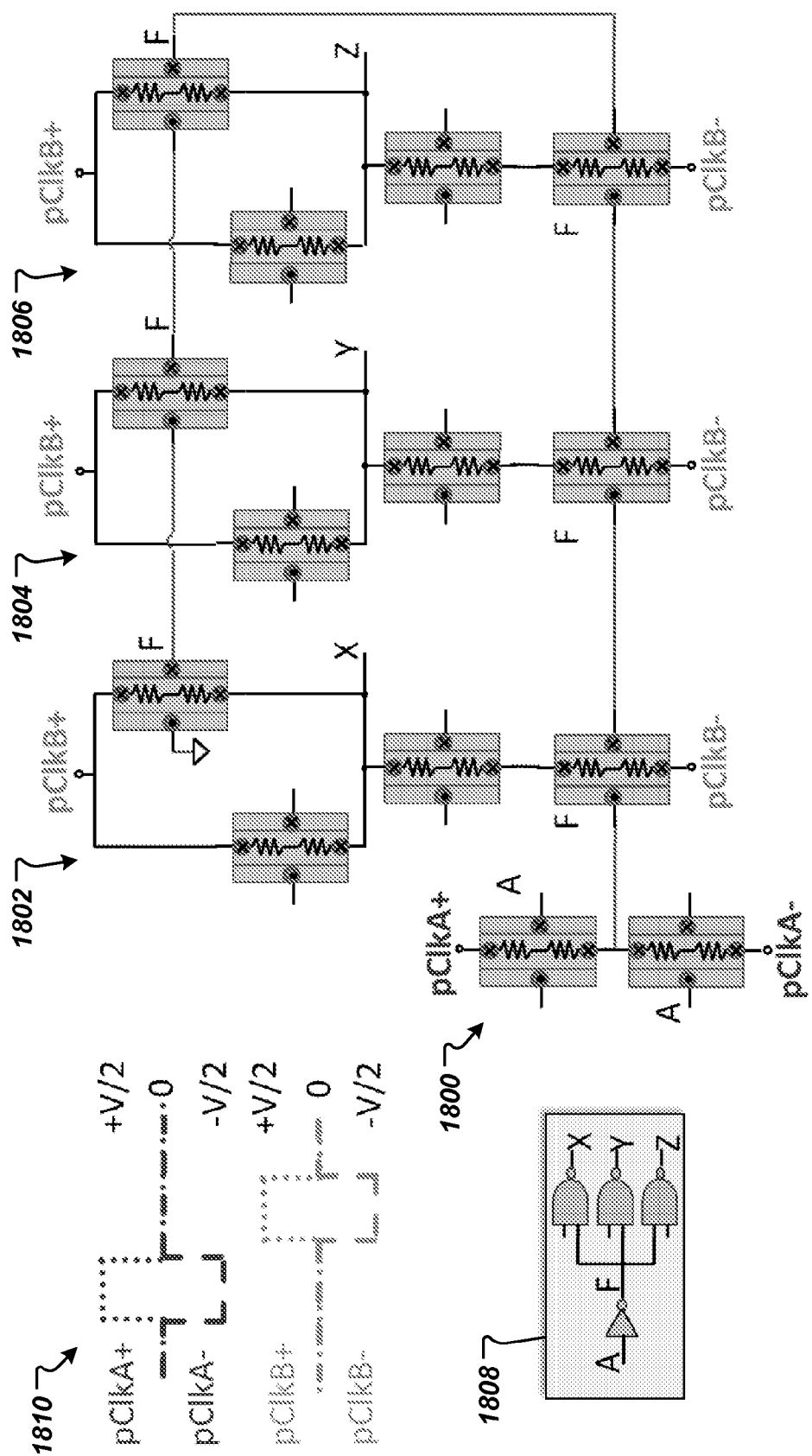
FIG. 18 shows a schematic representation of an inverter circuit driving three fanout NAND gates using nonvolatile magnetic logic devices.

The current steering concept described in FIGS. 16 and 17 can be extended to multiple gates. FIG. 18 shows a schematic representation of an inverter circuit 1800 driving three fanout NAND gates 1802, 1804, and 1806 using nonvolatile magnetic logic devices. The logic level diagram 1808 is shown at the bottom left. Unlike in CMOS circuits, the fanout gates 1802, 1804, and 1806 are serially-connected. The output signal F is steered through a serial chain of device write paths in the fanout NAND gates 1802, 1804, and 1806. To ensure the state of the output gates is fully written, those gates would not be evaluated until the current signal from the driving inverter (signal F) has had enough time to program the write paths. This is accomplished by clocking the power rails (pClks), as shown in timing diagram 1810, such that alternating stages of logic used non-overlapping phases of power. The nonvolatility of the devices may enable this strategy. Aside from aiding synchronization, pClking may also lead to energy savings, as gates are only powered when the system is ready to evaluate their states.

Figure 19:
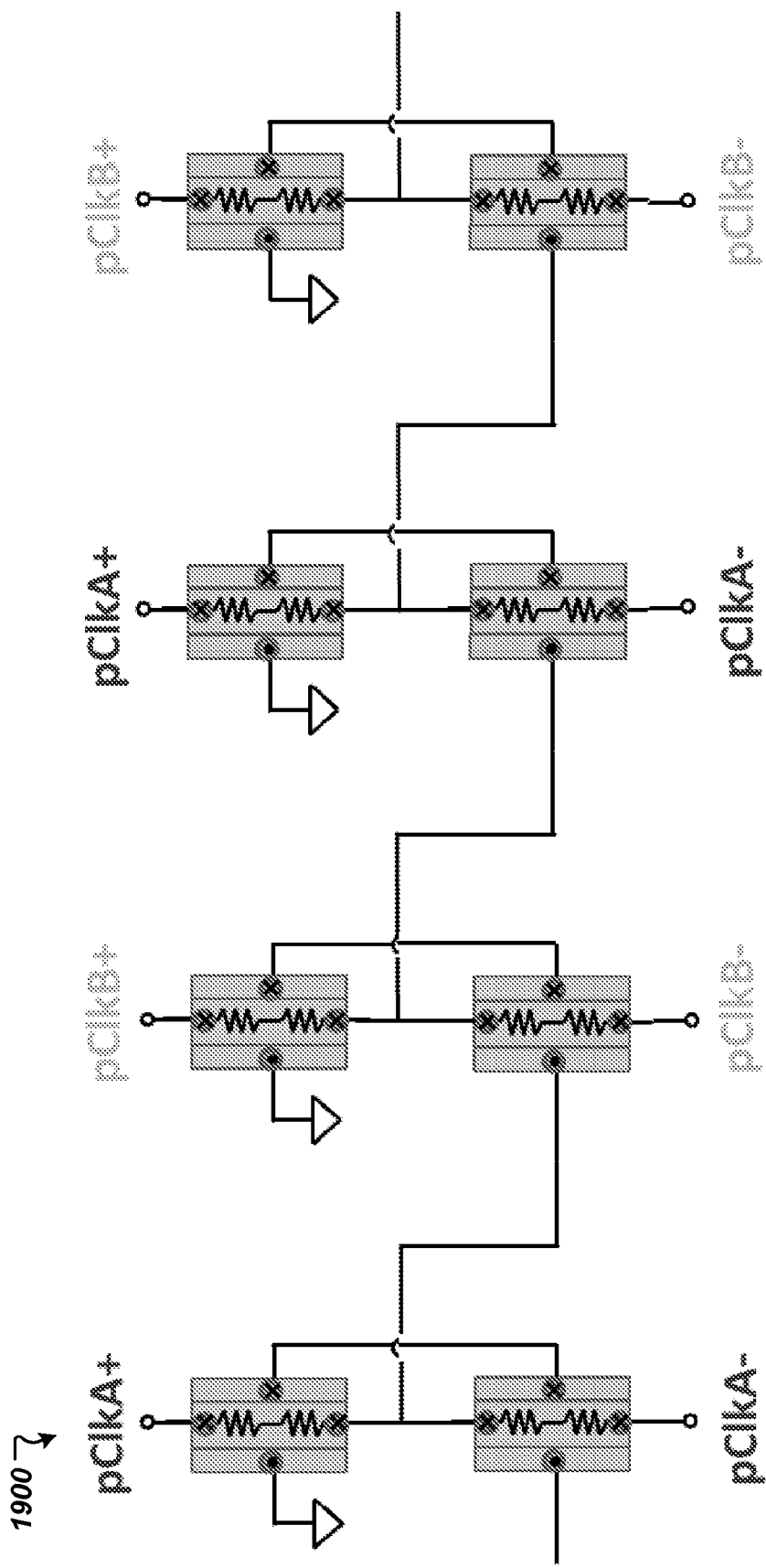
FIG. 19 shows a schematic representation of a chain of buffers or inverters constructed to form a shift register using nonvolatile magnetic logic devices.

FIG. 19 shows a schematic representation of a chain of buffers or inverters constructed to form a shift register 1900 using nonvolatile magnetic logic devices. Alternating stages use non-overlapping power clock phases. The data is shifted along the buffer/inverter chain with every clock pulse, propagated by the output current of the gate that is being powered at that time.

A number of implementations have been described. Nevertheless, various modifications can be made without departing from the spirit and scope of the processes and techniques described herein. In addition, the processes depicted in the figures do not require the particular order shown, or sequential order, to achieve desirable results. In addition, other steps can be provided, or steps can be eliminated, from the described processes, and other components can be added to, or removed from, the describe apparatus and systems. Accordingly, other embodiments are within the scope of the following claims.

What is claimed is:

1. A nonvolatile magnetic logic device, comprising:
an electrically insulating layer;
a write path adjacent to a first side of the electrically insulating layer, the write path comprising:
 a plurality of write path terminals; and
 a magnetic layer having a uniform magnetization direction that is indicative of a direction of magnetization of the magnetic layer in a steady state;
 wherein a logic state is written to the nonvolatile magnetic logic device by passing a current through the plurality of write path terminals;
 wherein the direction of magnetization of the magnetic layer represents the logic state of the nonvolatile magnetic logic device; and
 wherein the direction of magnetization is configured to be controlled by a direction of the current passed through the plurality of write path terminals; and
a read path that is adjacent to a second side of the electrically insulating layer, the read path comprising a plurality of read path terminals for evaluation of the logic state;
wherein the electrically insulating layer promotes electrical isolation between the read path and the write path and magnetic coupling of the read path to the write path, wherein the electrical isolation between the read path and the write path and the magnetic coupling promote passing of the current through the plurality of write path terminals, while the logic state is evaluated among the plurality of read path terminals.

2. The nonvolatile magnetic logic device of claim 1, wherein the read path further comprises at least one magnetic tunnel junction (MTJ) that comprises a reference layer having at least one fixed magnetization direction, a free layer having a switchable magnetization direction, and a tunnel barrier sandwiched between the reference layer and free layer.

3. The nonvolatile magnetic logic device of claim 2, wherein the magnetic layer is a write path magnetic layer, and wherein one or more of the write path magnetic layer, the reference layer, and the free layer have an in-plane magnetic anisotropy.

4. The nonvolatile magnetic logic device of claim 2, wherein one or more of the magnetic layer, the reference layer, and the free layer have a perpendicular magnetic anisotropy.

5. The nonvolatile magnetic logic device of claim 2, wherein the magnetic layer and the free layer each has a shape comprising a major axis and minor axis, wherein the major axis is greater in length than the minor axis.

6. The nonvolatile magnetic logic device of claim 2, wherein the shape comprises one or more of a rectangular shape and an elliptical shape.

7. The nonvolatile magnetic logic device of claim 2, wherein the read path further comprises a synthetic antiferromagnetic layer that pins the at least one fixed magnetization direction of the reference layer of the at least one MTJ.

8. The nonvolatile magnetic logic device of claim 2, wherein the read path has a first resistance when the magnetization directions of the reference layer and the free layer are substantially parallel, and the read path has a second resistance when the magnetization directions of the reference layer and the free layer are substantially antiparallel.

9. The nonvolatile magnetic logic device of claim 8, wherein the free layer is configured to switch with the magnetization direction of the write path, and the concurrent switching of the switchable magnetization direction causes a resistance of the read path to switch between the first resistance and the second resistance to promote evaluation of the logic state.

10. The nonvolatile magnetic logic device of claim 8, wherein the second resistance has an increased value relative to a value of the first resistance.

11. The nonvolatile magnetic logic device of claim 1, wherein the second side of the electrically insulating layer is opposite to the first side of the electrically insulating layer.

12. The nonvolatile magnetic logic device of claim 1, wherein the write path further comprises an underlayer and a capping layer, and the magnetic layer is positioned between the underlayer and the capping layer.

13. The nonvolatile magnetic logic device of claim 1, wherein the read path further comprises a first magnetic tunnel junction (MTJ) that comprises a first reference layer that is separate from a second reference layer of a second MTJ and wherein the first MTJ further comprises a free layer that is shared with the second MTJ.

14. The nonvolatile magnetic logic device of claim 1, wherein the read path further comprises at least one magnetic tunnel junction (MTJ), and wherein a read path terminal of the plurality of read path terminals is electrically coupled to a free layer of the at least one MTJ via an ohmic contact.

15. The nonvolatile magnetic logic device of claim 2, wherein the magnetic layer of the write path is ferromagnetically coupled to the free layer.

16. The nonvolatile magnetic logic device of claim 2, wherein the magnetic layer of the write path is antiferromagnetically coupled to the free layer.

17. The nonvolatile magnetic logic device of claim 1, wherein the magnetic layer of the write path comprises two or more sub-layers;
wherein each of the two or more sub-layers comprises a magnetic material;
wherein a first sub-layer of the two or more sub-layers has a thickness that differs from a thickness of a second sub-layer of the two more sub-layers;

wherein an adjacent layer of the two or more sub-layers is separated by a conductive spacer; and wherein magnetization directions of the adjacent layers of the two or more sub-layers are substantially antiparallel.

18. The nonvolatile magnetic logic device of claim 1, wherein the electrically insulating layer comprises a magnetic material.

19. The nonvolatile magnetic logic device of claim 1, wherein the electrically insulating layer comprises a non-magnetic material.

20. The nonvolatile magnetic logic device of claim 1, wherein the direction of magnetization of the magnetic layer of the write path is further configured to be controlled using a bias magnetic field.

21. The nonvolatile magnetic logic device of claim 1, wherein the read path further comprises a giant magnetoresistive (GMR) sensor comprising a reference layer having at least one fixed magnetization direction, a free layer having a switchable magnetization direction, and a conductive interlayer sandwiched between the reference layer and free layer.

22. The nonvolatile magnetic logic device of claim 21, wherein the read path further comprises a synthetic antiferromagnetic layer that pins the at least one fixed magnetization direction of the reference layer of the at least one GMR sensor.

23. A nonvolatile magnetic logic device, comprising:
a write path comprising:
a plurality of write path terminals each comprising at least one of gold, silver, platinum, copper, tungsten, and aluminum;
a write path magnetic layer comprising at least one of iron, cobalt, and nickel, the magnetic layer having a uniform magnetization direction that is indicative of a direction of magnetization of the magnetic layer in a steady state;
wherein a logic state is written to the nonvolatile magnetic logic device by passing a current through the plurality of write path terminals;
wherein the direction of magnetization of the write path magnetic layer represents the logic state of the nonvolatile magnetic logic device; and
wherein the direction of magnetization is configured to be controlled by a direction of the current passed through the plurality of write path terminals; and
a read path comprising:
at least one magnetic tunnel junction (MTJ) comprising:
a free layer having a switchable magnetization direction, the free layer comprising an alloy of iron, cobalt, and boron;
a reference layer having a fixed magnetization direction, the reference layer comprising an alloy of iron, cobalt, and boron; and
an insulating barrier layer between the free layer and the reference layer, the insulating barrier layer comprising at least one of magnesium oxide and aluminum oxide;
a synthetic antiferromagnetic layer comprising sub-layers of alternating cobalt alloys and non-magnetic ruthenium spacers, wherein the synthetic antiferromagnetic layer pins the fixed magnetization direction of the reference layer; and
a plurality of read path terminals for evaluation of the logic state, wherein each of the plurality of read path terminals comprises at least one of gold, silver, platinum, copper, tungsten, and aluminum; and
an electrically insulating layer positioned between the write path and the read path, the electrically insulating layer comprising an oxide of at least one of iron, nickel, and cobalt, wherein the electrically insulating layer promotes electrical isolation between the read path and the write path and magnetic coupling of the read path to the write path, wherein the electrical isolation and the magnetic coupling enables the current to be passed through the plurality of write path terminals, while the logic state is evaluated among the plurality of read path terminals.

24. A method comprising:
receiving, by a plurality of write path terminals of a write path of a nonvolatile magnetic logic device, a current that is used to write a logic state to the nonvolatile magnetic logic device;
passing the current through the plurality of write path terminals of the write path to control a direction of magnetization of a magnetic layer of the write path, wherein the direction of magnetization is controlled by a direction of the current passing through the plurality of write path terminals and the magnetic layer, wherein the magnetic layer has a uniform magnetization direction that is indicative of the direction of magnetization, and wherein the direction of magnetization represents the logic state of the nonvolatile magnetic logic device; and
providing, by a plurality of read path terminals of a read path of the nonvolatile magnetic logic device, a resistance corresponding to the logic state of the nonvolatile magnetic logic device for evaluation of the logic state;
wherein the read path is electrically isolated from the write path and magnetically coupled to the write path, and wherein electrical isolation and magnetic coupling enable the current to be passed through the plurality of write path terminals, while the logic state is evaluated among the plurality of read path terminals.

25. The method of claim 24, further comprising concurrently switching a direction of magnetization of a free layer of the read path with the direction of magnetization of the magnetic layer of the write path to cause the provided resistance to switch between a first resistance and a second resistance corresponding to the logic state.

26. The method of claim 24 wherein the current comprises a first current, and wherein providing the resistance corresponding to the logic state of the nonvolatile magnetic logic device comprises:
receiving, by the plurality of read path terminals of the read path, a second current for evaluation of the logic state;
passing the second current through the plurality of read path terminals, a reference layer, a tunnel barrier, and a free layer of the read path;
providing a first resistance when a direction of magnetization of the free layer of the read path is substantially parallel to a direction of magnetization of the reference layer of the read path; and
providing a second resistance when the direction of magnetization of the free layer of the read path is substantially antiparallel to the direction of magnetization of the reference layer of the read path.

27. The method of claim 26, further comprising pinning a fixed magnetization direction of the reference layer of the read path using a synthetic antiferromagnetic layer in the read path.

28. The method of claim 26, wherein the second resistance has an increased value relative to a value of the first resistance.

29. The method of claim 26, further comprising passing the second current through an ohmic contact between a read path terminal of the plurality of read path terminals and the free layer of the read path.

30. The method of claim 24, wherein magnetically coupling the read path to the write path comprises ferromagnetically coupling the read path to the write path.

31. The method of claim 24, wherein magnetically coupling the read path to the write path comprises antiferromagnetically coupling the read path to the write path.

32. The method of claim 24, further comprising controlling the direction of magnetization of the magnetic layer using a bias magnetic field.

\* \* \* \* \*